United States Patent
Fukuda et al.

(10) Patent No.: US 10,490,705 B2
(45) Date of Patent: Nov. 26, 2019

(54) PACKAGE AND LIGHT EMITTING DEVICE

(71) Applicant: NICHIA CORPORATION, Anan-shi (JP)

(72) Inventors: Mayumi Fukuda, Tokushima (JP); Tomohisa Kishimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/053,803

(22) Filed: Aug. 3, 2018

(65) Prior Publication Data

US 2018/0342651 A1 Nov. 29, 2018

Related U.S. Application Data

(62) Division of application No. 15/373,345, filed on Dec. 8, 2016, now Pat. No. 10,079,332.

(30) Foreign Application Priority Data

Dec. 9, 2015 (JP) .................................. 2015-240616

(51) Int. Cl.
*H01L 33/48* (2010.01)
*B29C 45/14* (2006.01)
(Continued)

(52) U.S. Cl.
CPC ............ *H01L 33/486* (2013.01); *B29C 41/00* (2013.01); *B29C 45/14655* (2013.01);
(Continued)

(58) Field of Classification Search
CPC .............. B29C 33/12; B29C 45/14065; B29C 45/14655; H01L 33/486; H01L 33/502; H01L 33/56; H01L 33/60; H01L 33/62
See application file for complete search history.

(56) References Cited

U.S. PATENT DOCUMENTS

| | | |
|---|---|---|
| 2008/0012036 A1 | 1/2008 | Loh et al. |
| 2008/0121921 A1 | 5/2008 | Loh et al. |

(Continued)

FOREIGN PATENT DOCUMENTS

| | | |
|---|---|---|
| CN | 202797084 U | 3/2013 |
| CN | 203351644 U | 12/2013 |

(Continued)

OTHER PUBLICATIONS

Office Action with Form PTO-892 Notice of References Cited issued by the U.S. Patent and Trademark Office for the parent U.S. Appl. No. 15/373,345, dated Nov. 3, 2017.
(Continued)

*Primary Examiner* — Joseph M Galvin, III
(74) *Attorney, Agent, or Firm* — Mori & Ward, LLP

(57) ABSTRACT

A package has a bottomed recess with a bottom portion. The package includes: a first electrode having a first outer lead portion and disposed in the bottom portion; a second electrode having a second outer lead portion and disposed in the bottom portion; and a first resin fixing the first electrode and the second electrode and constituting a part of the bottomed recess. The first resin has: a part between the first electrode and the second electrode disposed in the bottom portion; a wall portion constituting side walls of the bottomed recess; and a flange portion having a first part located adjacent to at least one of both sides of the first outer lead portion in plan view. The first part has a thickness different from a thickness of the first outer lead portion. A light emitting has: the package; and a light emitting element mounted on at least one of the first electrode and the second electrode of the package.

20 Claims, 27 Drawing Sheets

(51) Int. Cl.
*H01L 33/50* (2010.01)
*H01L 33/56* (2010.01)
*H01L 33/60* (2010.01)
*H01L 33/62* (2010.01)
*B29C 41/00* (2006.01)
*B29C 33/12* (2006.01)

(52) U.S. Cl.
CPC ............ *H01L 33/502* (2013.01); *H01L 33/56* (2013.01); *H01L 33/60* (2013.01); *H01L 33/62* (2013.01); *B29C 33/12* (2013.01); *B29C 45/14065* (2013.01); *H01L 2933/005* (2013.01); *H01L 2933/0033* (2013.01); *H01L 2933/0058* (2013.01); *H01L 2933/0066* (2013.01)

(56) References Cited

U.S. PATENT DOCUMENTS

| | | | |
|---|---|---|---|
| 2012/0037944 A1* | 2/2012 | Takine | H01L 33/58 257/98 |
| 2012/0205712 A1 | 8/2012 | Hayashi | |
| 2013/0292812 A1 | 11/2013 | Seo et al. | |
| 2014/0021592 A1 | 1/2014 | Chi | |
| 2014/0203304 A1 | 7/2014 | Kim et al. | |
| 2014/0248724 A1* | 9/2014 | Lin | H01L 33/60 438/27 |
| 2015/0340568 A1 | 11/2015 | Hsieh et al. | |
| 2016/0093785 A1 | 3/2016 | Fukuda | |

FOREIGN PATENT DOCUMENTS

| | | |
|---|---|---|
| CN | 103579470 | 2/2014 |
| CN | 203466217 U | 3/2014 |
| CN | 203967130 U | 11/2014 |
| CN | 203967131 U | 11/2014 |
| CN | 204333031 U | 5/2015 |
| CN | 204558528 U | 8/2015 |
| JP | 10-209192 | 8/1998 |
| JP | 2008-072092 | 3/2008 |
| JP | 2008-182242 | 8/2008 |
| JP | 2009-283883 | 12/2009 |
| JP | 2010-186896 | 8/2010 |
| JP | 5246662 B2 | 8/2010 |
| JP | 2011-103437 | 5/2011 |
| JP | 2011-233928 | 11/2011 |
| JP | 2012-039162 | 2/2012 |
| JP | 2013-051296 | 3/2013 |
| JP | 2013-077813 | 4/2013 |
| JP | 2013-183013 | 9/2013 |
| JP | 2013-236085 | 11/2013 |
| JP | 2014-022720 | 2/2014 |
| JP | 2015-005584 | 1/2015 |
| JP | 2015-015327 | 1/2015 |
| JP | 2015-015404 | 1/2015 |
| JP | 2015-015405 | 1/2015 |
| JP | 2015-015406 | 1/2015 |
| JP | 2015-018847 | 1/2015 |
| JP | 2015-226063 | 12/2015 |
| JP | 2016-072607 | 5/2016 |
| KR | 10-2012-0050283 | 5/2012 |

OTHER PUBLICATIONS

Notice of Allowance with Form PTO-892 Notice of References Cited issued by the United States Patent and Trademark Office for the parent U.S. Appl. No. 15/373,345, dated May 29, 2018.

* cited by examiner

PACKAGE AND LIGHT EMITTING DEVICE

CROSS-REFERENCE TO RELATED APPLICATION

This is a divisional application of the U.S. patent application Ser. No. 15/373,345 filed on Dec. 8, 2016, which claims priority to Japanese Patent Application No. 2015-240616, filed on Dec. 9, 2015, the entire disclosure of which is hereby incorporated by reference.

BACKGROUND

1. Technical Field

The present disclosure relates to a package and a light emitting device.

2. Description of Related Art

Japanese Unexamined Patent Application Publication No. 2010-186896 and Japanese Unexamined Patent Application Publication No. 2013-051296 disclose the following method for manufacturing a package:

A lead frame is held in a mold. The lead frame is placed on a bottom surface of a bottomed recess. A molding resin is injected into the mold from a rear side opposite to an opening side of the bottomed recess. The molding resin is processed by insert molding and then solidified. Then leads are folded to make a package.

Japanese Unexamined Patent Application Publication No. 2013-077813 discloses a package in which a resin-molded body is integrally formed with a lead frame and which has a concavity on an upper surface of which a light emitting element is attached. The lead frame is constituted by inner leads. Each of the inner leads has portions embedded in the resin-molded body, which portions each have at an end thereof an end bent portion bent upward from the bottom of the inner lead. The lead frame has been bent prior to being placed in the mold.

SUMMARY OF THE INVENTION

A package according to an embodiment of the present disclosure has a bottomed recess with a bottom portion. The package has: a first electrode having a first outer lead portion and disposed in the bottom portion; a second electrode having a second outer lead portion and disposed in the bottom portion; and a first resin fixing the first electrode and the second electrode and constituting a part of the bottomed recess. In this package, the first resin has: a part between the first electrode and the second electrode disposed in the bottom portion; a wall portion constituting side walls of the bottomed recess; and a flange portion which has a part having a thickness different from a thickness of the first outer lead portion and located adjacent to at least one of both sides of the first outer lead portion in plan view.

A light emitting device according to an embodiment of the present disclosure has: the package; and a light emitting element mounted on at least one of the first electrode and the second electrode of the package.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
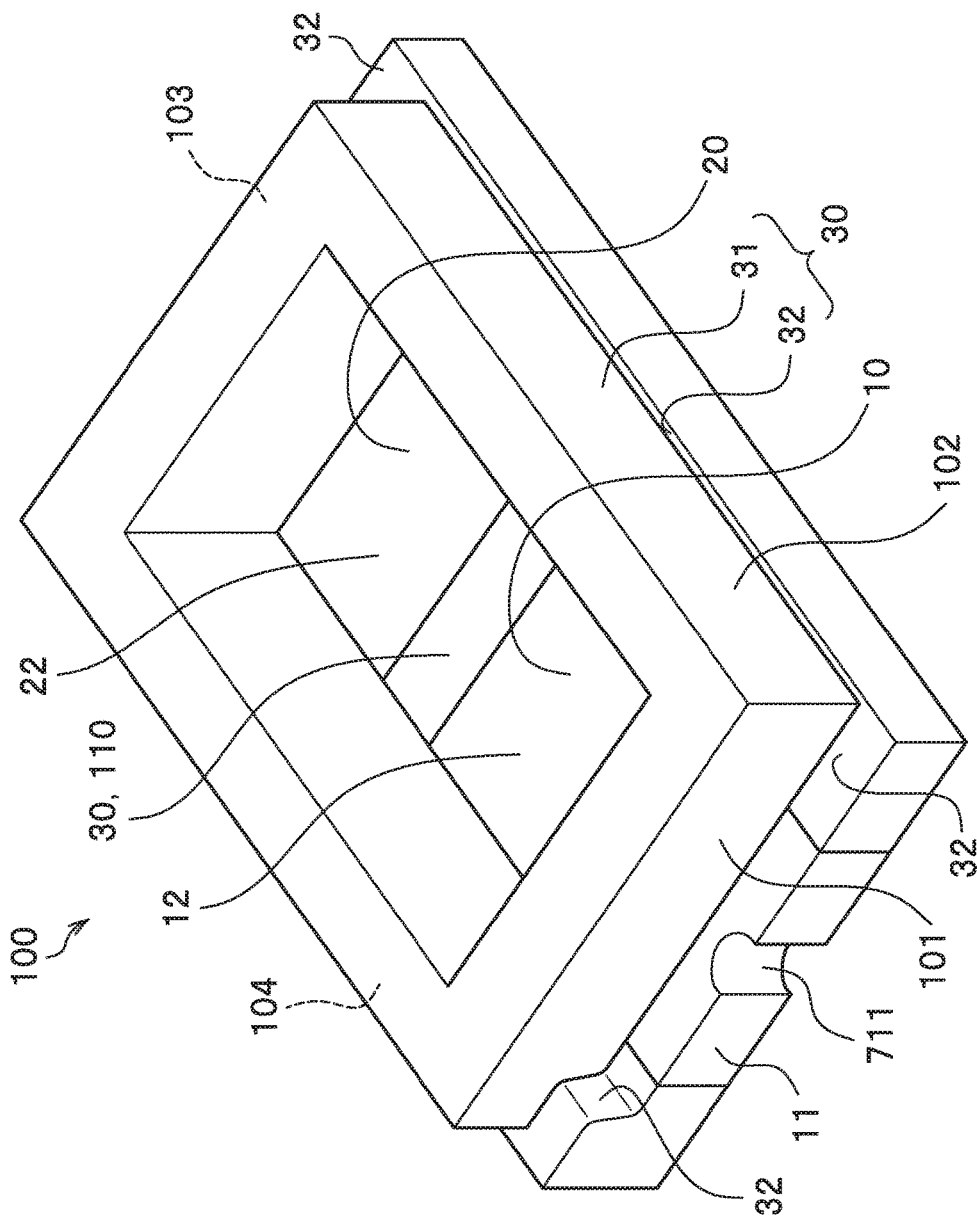
FIG. 1 is a schematic perspective view showing the whole of a package according to a first embodiment of the present disclosure.

The embodiments will now be described with reference to the accompanying drawings, wherein like reference numerals designate corresponding or identical elements throughout the various drawings.

Description will be given of a package, a light emitting device, and a manufacturing method thereof, which represent exemplary embodiments of the present disclosure. Drawings referenced in the following description schematically shows embodiments. Thus, scales of members, distances between members, and positional relation between members or the like may have been presented in an exaggerated manner, and illustration of a part of a member may have been omitted. In the following description, members that are the same or analogous will be given the same name or number in principle, and duplicative detailed descriptions will be appropriately omitted.

Unless specifically stated, a term of "width" is used when measuring in a direction perpendicular to a wall portion and a term of "length" is used when measuring in a direction parallel to the wall portion.

Package and Light Emitting Device According to First Embodiment Structure of Package 100

Figure 2:
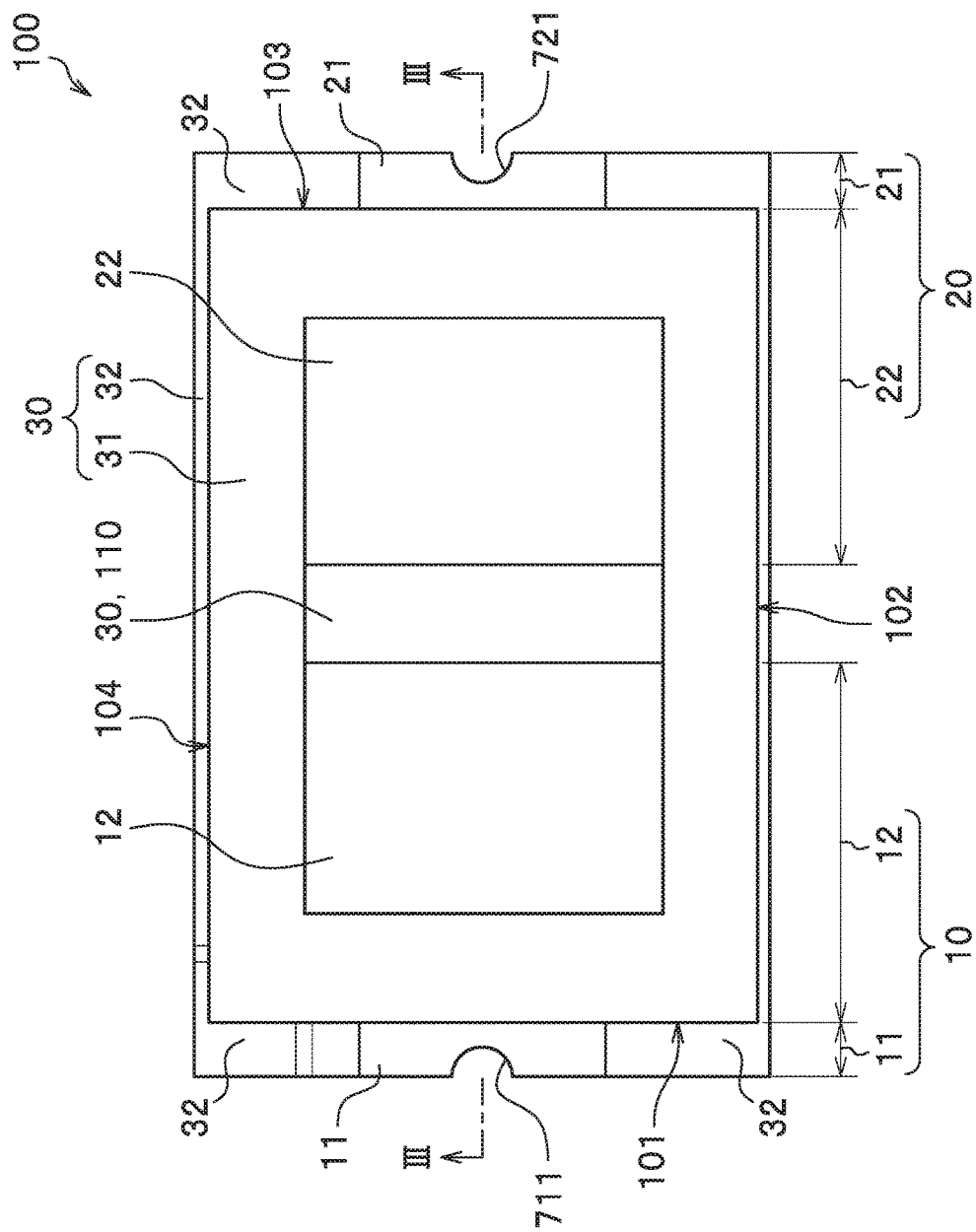
FIG. 2 is a schematic top view of the package according to the first embodiment.
Figure 3:
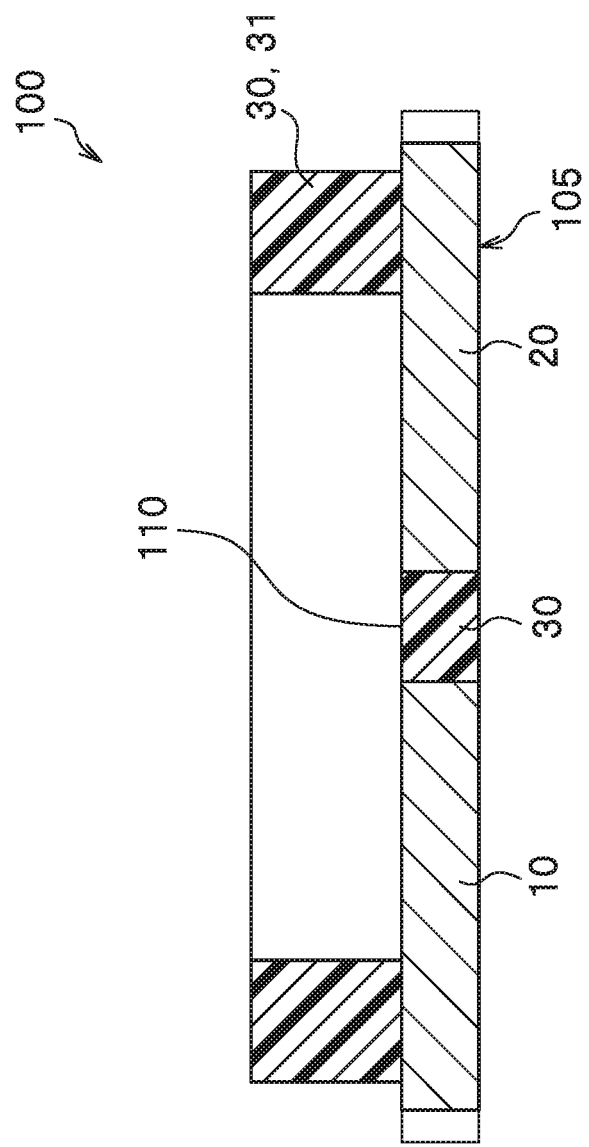
FIG. 3 is a schematic cross-section of the package according to the first embodiment, viewed in the direction of the arrows in FIG. 2.
Figure 4:
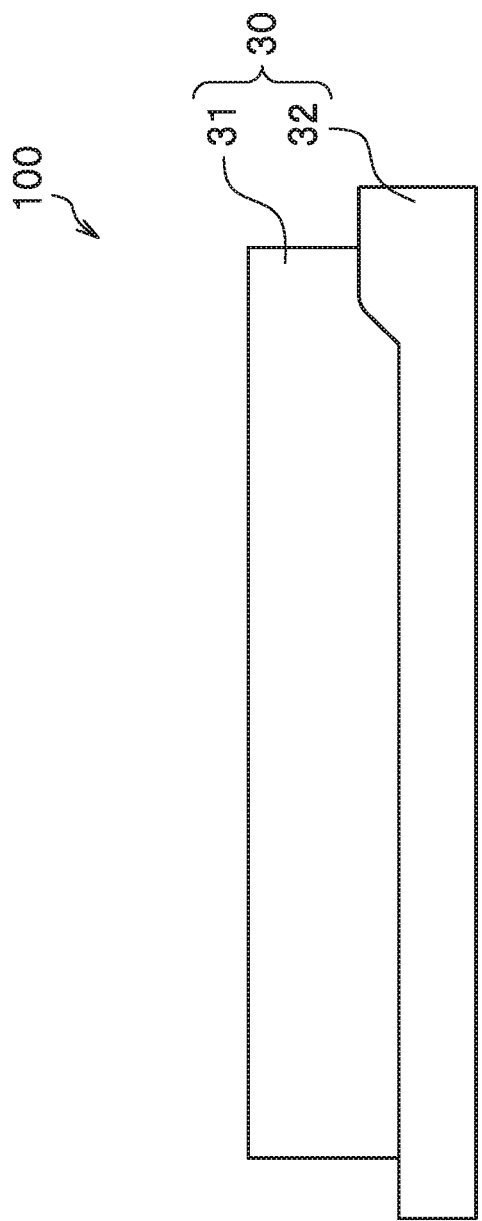
FIG. 4 is a schematic side view of the package according to the first embodiment.
Figure 5:
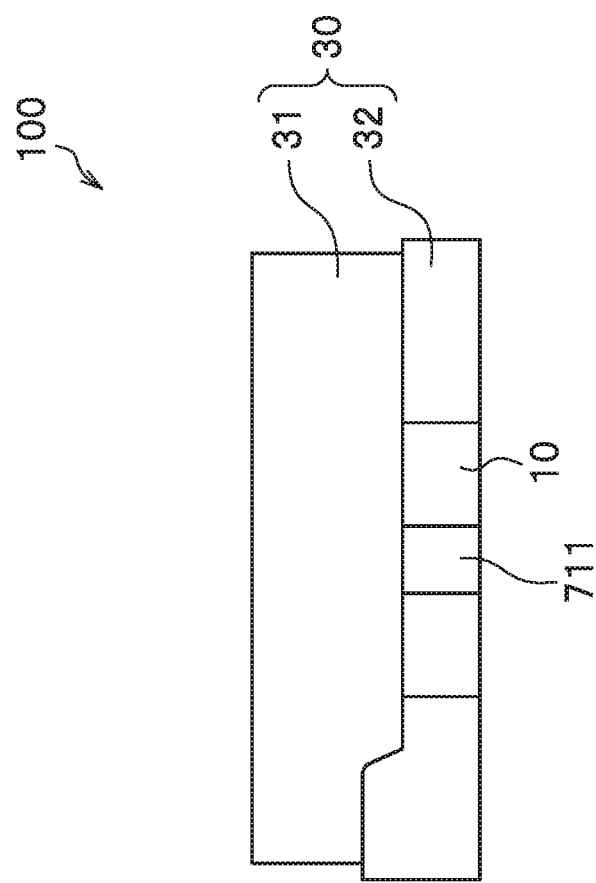
FIG. 5 is a schematic side view of the package according to the first embodiment.
Figure 6:
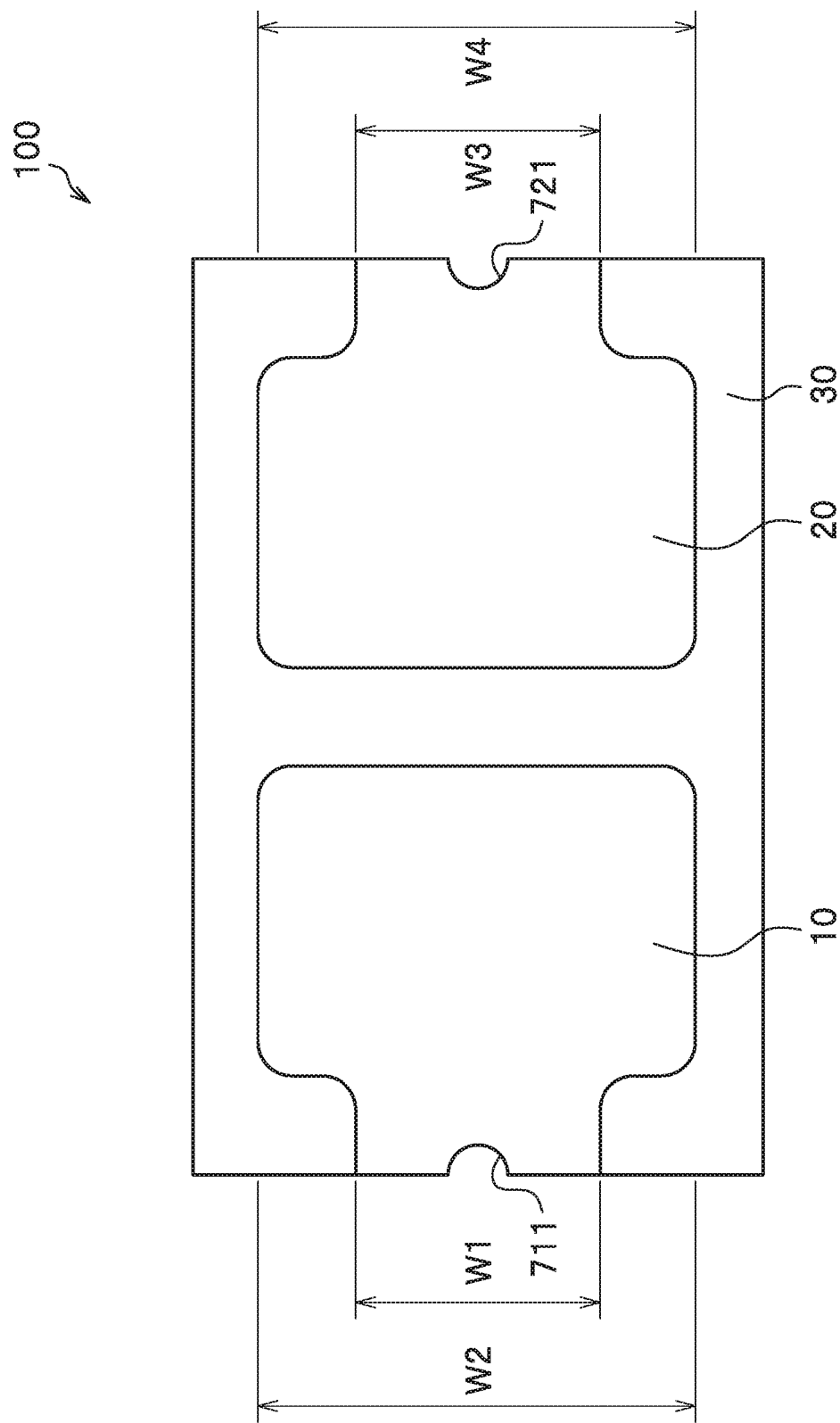
FIG. 6 is a schematic bottom view of the package according to the first embodiment.

Description will be given of a package 100 according to a first embodiment of the present disclosure with reference to drawings. FIG. 1 is a schematic perspective view showing the whole of a package according to the first embodiment of the present disclosure. FIG. 2 is a schematic top view of the package according to the first embodiment. FIG. 3 is a schematic cross-section of the package according to the first embodiment, viewed in the direction of the arrows in FIG. 2. FIG. 4 is a schematic side view of the package according to the first embodiment. FIG. 5 is a schematic side view of the package according to the first embodiment. FIG. 6 is a schematic bottom view of the package according to the first embodiment.

A package 100 is in an approximately rectangular prism as a whole, in which a bottomed recess 110 is formed. The package 100 has a first electrode 10, a second electrode 20, and a first resin 30.

The first electrode 10 has a first outer lead portion 11 and a first inner lead portion 12.

The first outer lead portion 11 refers to a lead portion located outside of a wall portion 31 of the first resin 30. The first outer lead portion 11 has a distal end at which a first notch 711 is provided and extends perpendicular to the wall portion 31. However, the shape of the first outer lead portion 11 is not limited thereto. The first outer lead portion 11 may further be provided with notches, recesses, and/or through-holes. Note that the first outer lead portion 11 may have a flat distal end with no recess.

The first inner lead portion 12 refers to a lead portion located on the inner side of the wall portion 31 of the first resin 30 and a lead portion located under the wall portion 31 of the first resin 30. The first inner lead portion 12 has an approximately rectangular shape in plan view, but is not limited thereto. The first inner lead portion 12 may be provided with notches, recesses, and/or through-holes. In bottom view of the package 100, a width W1 of the first outer lead portion 11, which is exposed from the first resin 30, is shorter than a width W2 of the first inner lead portion 12, which is exposed from the first resin 30. The first inner lead portion 12 is disposed in a bottom portion of the bottomed recess 110.

The second electrode 20 has a second outer lead portion 21 and a second inner lead portion 22. The second outer lead portion 21 refers to a lead portion located outside of the wall portion 31 of the first resin 30. The second outer lead portion 21 has a distal end at which a second notch 721 is provided and extends perpendicular to the wall portion 31. However, the shape of the second outer lead portion 21 is not limited thereto. The second outer lead portion 21 may further be provided with notches, recesses, and/or through-holes. Note that the second outer lead portion 21 may have a flat distal end with no recess.

The second inner lead portion 22 refers to a lead portion located on the inner side of the wall portion 31 of the first resin 30 and a lead portion located under the wall portion 31 of the first resin 30. The second inner lead portion 22 has an approximately rectangular shape in plan view, but is not limited thereto. The second inner lead portion 22 may be provided with notches, recesses, and/or through-holes. In bottom view of the package 100, a width W3 of the second outer lead portion 21, which is exposed from the first resin 30, is shorter than a width W4 of the second inner lead portion 22, which is exposed from the first resin 30. The second inner lead portion 22 is disposed in the bottom portion of the bottomed recess 110.

The first electrode 10 and the second electrode 20 are formed such that they are exposed outwardly from the first resin 30 on a lower surface 105 of the package 100. The lower surface 105 of the package 100 is to be mounted on an external board. The first electrode 10 and the second electrode 20 are spaced apart from each other, so that the first resin 30 is interposed therebetween to be a part of the bottom portion of the bottomed recess 110. When the package 100 is used for a light emitting device 1, the first electrode 10 and the second electrode 20 respectively correspond to an anode electrode and a cathode electrode and thus have different polarities.

The length, width, and thickness of the first electrode 10 and the second electrode 20 are not particularly limited and are appropriately determined in accordance with the intended use. The first outer lead portion 11 has an upper surface and a lower surface each plated with a metal, a side surface located in the first notch 711 and plated with a metal, and side surfaces located adjacent to both sides of the first notch 711 and not plated with a metal. Similarly, the second outer lead portion 21 has an upper surface and a lower surface each plated with a metal, a side surface located in the second notch 721 and plated with a metal, and side surfaces located adjacent to both sides of the second notch 721 and not plated with a metal. The first outer lead portion 11 and the second outer lead portion 21 are plated with a metal as described, and thus the light emitting device 1 is suitably mounted using solder or the like. Solder has good bonding properties for plated surfaces but has poor bonding properties for non-plated surfaces. Thus, increasing the area of a plated metal layer enables the solder to creep up to the surface of the metal layer, facilitating application of solder. In this regard, it is preferable to increase the areas of the side surfaces in the first notch 711 and the second notch 721.

Preferably, the first electrode 10 and the second electrode 20 are made of a material such as copper, iron, a copper alloy, or an iron alloy and have a topmost surface plated with a metal material having high light reflectivity such as silver, aluminum, or gold. Although the thickness of the metal plated on the first electrode 10 or the like is not particularly limited, the thickness is preferably about 0.1 to 30 μm, and more preferably about 1 to 20 μm, to facilitate efficient reflection. In addition, it is preferable that the metal is formed in a film or layer having a uniform thickness. The metal layer is not limited to a single layer. The metal layer may be formed in two or more layers.

The first resin 30 has the wall portion 31 and a flange portion 32. The first resin 30 fixes the first electrode 10 and the second electrode 20. The wall portion 31 constitutes side walls of the bottomed recess 110. The flange portion 32 has a part having a thickness different from the thickness of the first outer lead portion 11. The flange portion 32 has an approximately uniform width extending outwardly from the wall portion 31 at both sides of the first outer lead portion 11 in plan view. In plan view, the wall portion 31 has four sides forming a rectangle on the first electrode 10 and the second electrode 20. The wall portion 31 is formed such that a pair of opposite sides of the rectangle sandwiches the first electrode 10 and the second electrode 20. With this structure, the wall portion 31 fixes the first electrode 10 and the second electrode 20. The first resin 30 has a part located between the first electrode 10 and the second electrode 20, which are disposed in the bottom portion of the bottomed recess 110. Hereinafter, when the first resin 30 at the bottom portion of the bottomed recess 110 is said to have "approximately the same thickness" as the thickness of the first electrode 10, the thickness of the first resin 30 is 0.8 to 1.0 times the thickness of the first electrode 10. The first resin may have physically the same thickness as the thickness of the first electrode 10, i.e., a thickness of 1.0 times the thickness of the first electrode 10, or may have a thickness smaller than that of the first electrode 10, at the bottom portion of the bottomed recess 110. For example, a part of the first resin 30 located between the first electrode 10 and the second electrode 20 may have a thickness smaller than that of the first electrode 10. This efficiently prevents a short circuit between the first electrode 10 and the second electrode 20. The first resin 30 may have a hollowed surface from the first electrode 10 and the second electrode 20 in bottom view.

Note that the term first resin 30 is commonly used irrespective of before or after molding, curing, or solidifying. For example, when an epoxy resin is used as the first resin 30, the first resin 30 is in a liquid form or in an indefinite form before molding, whereas the first resin 30 takes a predetermined shape after molding.

In plan view, the package 100 has a first outer side 101, a second outer side 102 adjacent to the first outer side 101, a third outer side 103 adjacent to the second outer side 102 and opposite the first outer side 101, and a fourth outer side 104 adjacent to the first outer side 101 and the third outer side 103. The first outer lead portion 11 is located at the first outer side 101. The second outer lead portion 21 is located at the third outer side 103.

The wall portion 31 is formed so as to constitute a recess having a rectangular shape in plan view. In other words, the wall portion 31 is in a rectangular loop shape in plan view. The height, length, and width of the wall portion 31 are not particularly limited and are appropriately determined in accordance with the intended use.

The first resin 30 has the flange portion 32, which laterally projects from the wall portion 31 in plan view. The flange portion 32 has parts formed adjacent to the first outer lead portion 11 located at the first outer side 101 and has parts formed adjacent to the second outer lead portion 21 located at the third outer side 103. At least one of the parts of the flange portion 32 which are respectively formed adjacent to the both sides of the first outer lead portion 11 has a thickness different from the thickness of the first outer lead portion 11.

In this embodiment, one of the parts of the flange portion 32 which are respectively located adjacent to both sides of the first outer lead portion 11 is thicker than the first outer lead portion 11. Preferably, the thicker part of the flange portion 32 located adjacent to the first outer lead portion 11 has a thickness of 1.2 to 2.0 times the thickness of the first outer lead portion 11. More preferably, the thicker part of the flange portion 32 located adjacent to the first outer lead portion 11 has a portion having a thickness of 1.2 to 2.0 times the thickness of the first outer lead portion 11 and a portion having the same thickness as the thickness of the first outer lead portion 11. More preferably, the thicker part of the flange portion 32 located adjacent to the first outer lead portion 11 has a portion having a thickness of 1.3 to 1.8 times the thickness of the first outer lead portion 11. The flange portion 32 having a predetermined thickness reduces unsmoothness occurring in the mounting of the light emitting device.

Incidentally, the thickness thus formed on the flange portion 32 may function as a cathode mark or an anode mark.

Preferably, the part of the flange portion 32 located adjacent to and having a thickness different from the first outer lead portion 11 has approximately the same width as the width of the first outer lead portion 11. This results in a constant width of the flange portion 32 in plan view.

The flange portion 32 has parts respectively located adjacent to both sides of the second outer lead portion 21 at the third outer side 103. Alternatively, the flange portion 32 may have one part located adjacent to at least one of the both sides of the second outer lead portion 21 at the third outer side 103. The flange portion 32 also has parts respectively located along the second outer side 102 and the fourth outer side 104. Alternatively, the flange portion 32 may have either of those parts respectively located along the second outer side 102 and the fourth outer side 104. It is preferable that the width of the part of the flange portion 32 located along the second outer side 102 be approximately the same as the width of the part of the flange portion 32 located along the fourth outer side 104. This is because this configuration brings stability to the package due to a good balance. It is preferable that the widths of the parts of the flange portion 32 respectively located at both sides of the first outer lead portion 11 be approximately the same as the width of the part of the flange portion 32 located along the second outer side 102. This is because a stress exerted on the flange portion 32 is uniformly distributed by making the flange portion 32 have the same width along the four outer sides 101, 102, 103, and 104.

As described, it is preferable that the thickness of the first electrode 10 be different from the thickness of one of the parts of the flange portion 32 respectively located adjacent to both sides of the first outer lead portion 11. It is further preferable that the thickness of the first electrode 10 be approximately the same as the thickness of the other one of the parts of the flange portion 32 respectively located adjacent to both sides of the first outer lead portion 11, and that the thickness of the part of the flange portion 32 located along the second outer side 102 be also approximately the same as the thickness of the other one of the parts of the flange portion 32 respectively located adjacent to both sides of the first outer lead portion 11. This is because a stress exerted on the flange portion 32 is uniformly distributed also by this configuration.

Preferably, the second outer side 102 and the fourth outer side 104 are composed of the first resin 30 only. This means that the first electrode 10 and the second electrode 20 are not exposed from the first resin 30. This resists ingress of moisture or the like into the first resin 30.

The first outer lead portion 11, the second outer lead portion 21, and the flange portion 32 may be formed flush with one another. Alternatively, the first outer lead portion 11 and the second outer lead portion 21 may project outwardly than the flange portion 32. These structures allow the package to be mounted on a mounting surface with the first outer lead portion 11 and the second outer lead portion 21 and thus improve stability of the mounting of the package. In the first embodiment, an inlet 555 through which the first resin 30 is injected is provided at a location corresponding to a hollow space adjacent to the first electrode 10 the first resin 30 cured or solidified in which hollow space is removed afterward. This results in a part of the flange portion 32 remaining adjacent to the first electrode 10. The first resin 30 has the flange portion 32 along the four sides of the wall portion 31. However, the first resin 30 may have the flange portion 32 along at least one of the four sides of the wall portion 31. When an outer side of the wall portion 31 is not provided with a flange portion, the outer side of the wall portion 31 is formed in a planar fashion from a top surface of the wall portion 31 to a bottom surface of the wall portion 31.

It is preferable that the width of the flange portion 32 provided along the first outer side 101 to the fourth outer side 104 be shorter than the width of the wall portion 31. Although depending on the size of the package 100, the width of the flange portion 32 is preferably at most 1 mm, more preferably at most 0.5 mm, and still more preferably at most 0.1 mm.

Examples of the material for the first resin 30 include thermoplastic resins and thermosetting resins.

As a thermoplastic resin, a polyphthalamide resin, a liquid crystal polymer, a polybutylene terephthalate (PBT), an unsaturated polyester, a polyamide resin or the like may be used.

As a thermosetting resin, an epoxy resin, a modified epoxy resin, a silicone resin, and a modified silicone resin or the like may be used.

Preferably, the first resin 30 contains a light reflecting material to efficiently reflect light at an inner wall surface of the wall portion 31 of the first resin 30. Examples of the light reflecting material include a white filler such as titanium oxide, glass filler, silica, alumina, and zinc oxide, which are highly reflective. The light reflecting material preferably has a visible light reflectance of 70% or more, or more preferably of 80% or more. In particular in the wavelength region of the light emitted by the light emitting element, the light reflecting material preferably has a reflectance of 70% or more, or more preferably of 80% or more. The content of the titanium oxide or the like may be at least 5% by weight and at most 50% by weight, and preferably 10 to 30% by weight.

As described above, the inlet 555 into which the first resin 30 is injected is provided to a hollow space the first resin 30 cured or solidified in which hollow space is removed afterward. This enables the package 100 to be made thin. In particular, the thickness of the under surface of the package 100, i.e., the thicknesses of the flange portion 32 of the first resin 30, the first electrode 10, and the second electrode 20, may be made thinner than those of conventional packages. This enables improvement in heat dissipation of an operating light emitting element mounted on the package 100.

Method for Manufacturing Package 100 and Light Emitting Device 1

Figure 7:
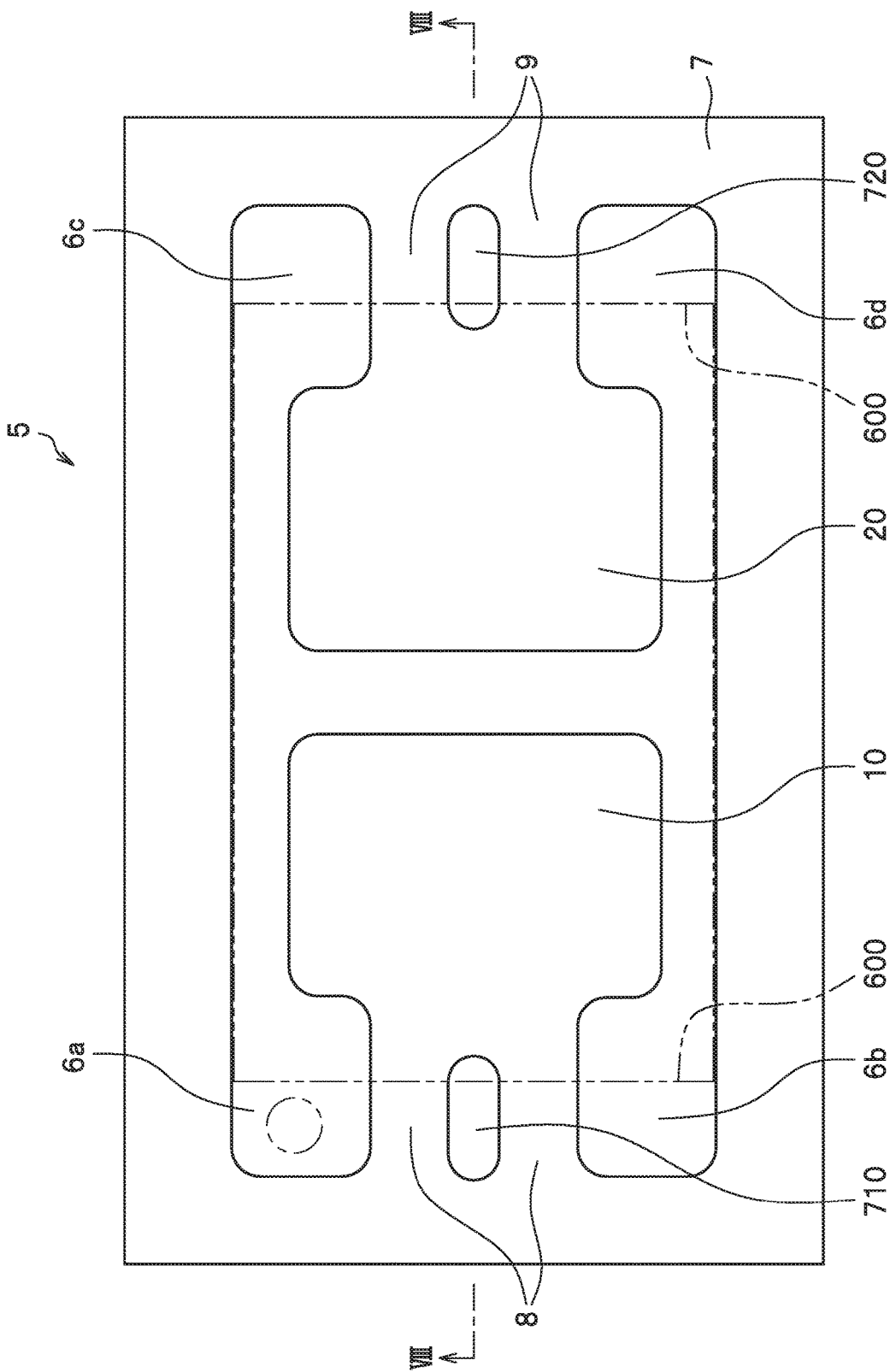
FIG. 7 is a plan view of a lead frame, representing an aspect of a process for manufacturing the package according to the first embodiment.
Figure 8:
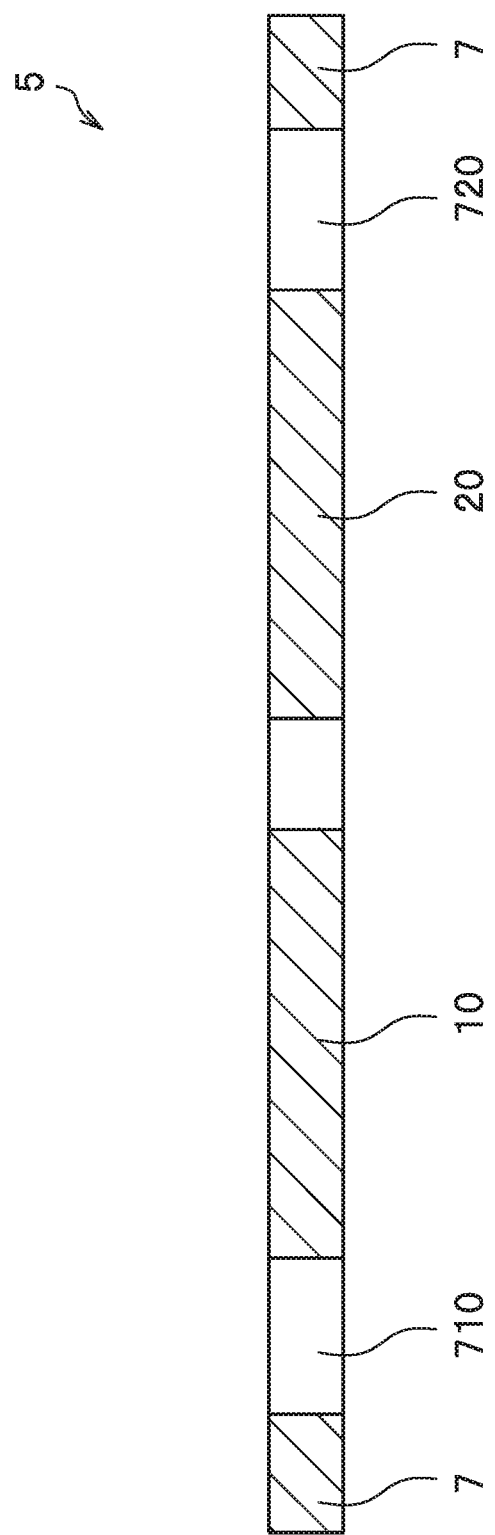
FIG. 8 is a schematic cross-section of the package, viewed in the direction of the arrows VIII-VIII in FIG. 7 and representing an aspect of a process for manufacturing the package according to the first embodiment.
Figure 9:
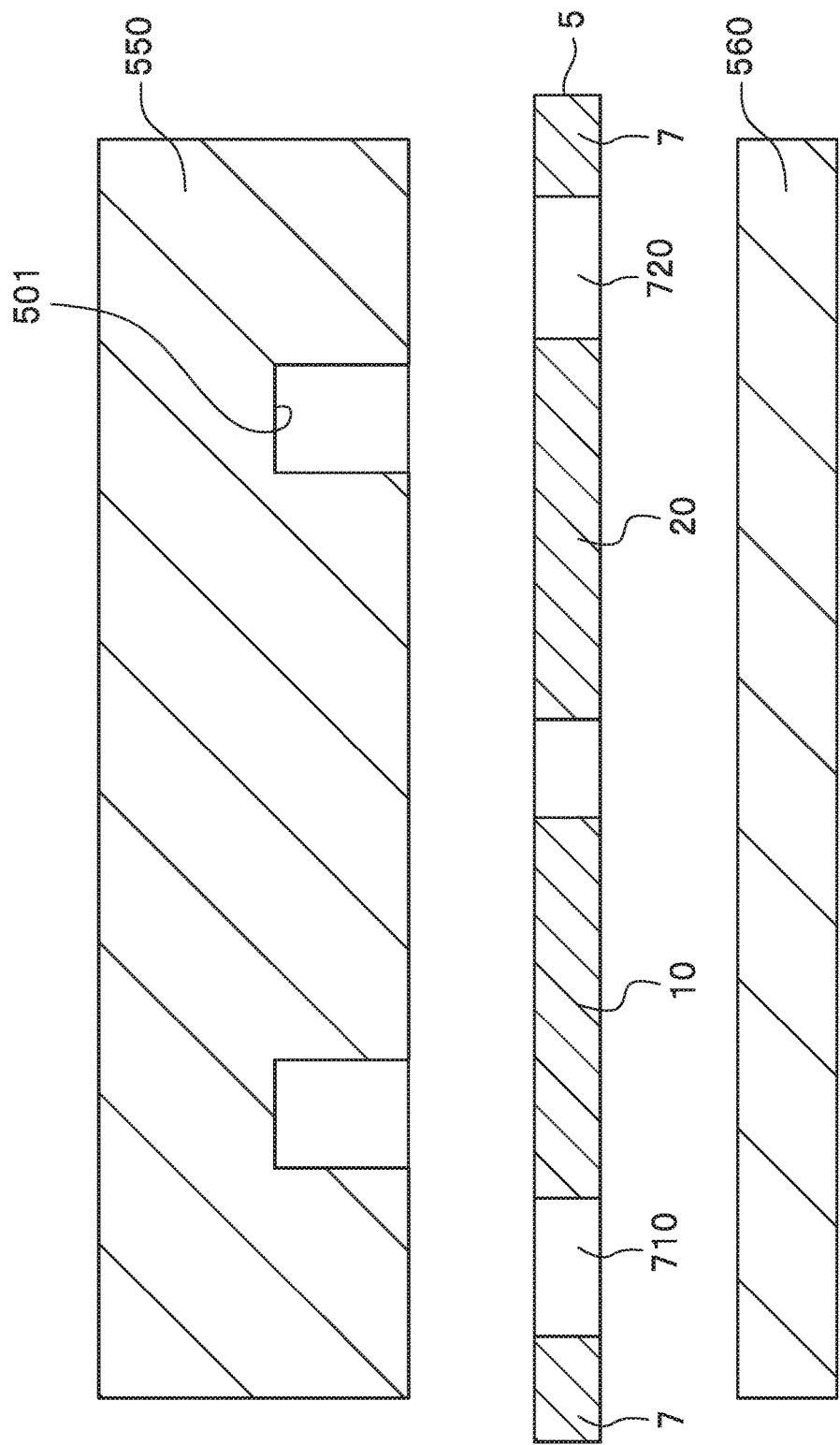
FIG. 9 is a cross-sectional view schematically showing the arrangement of the lead frame and a mold, taken along a line corresponding to the line XII-XII in FIG. 11, representing an aspect of a process for manufacturing the package according to the first embodiment.
Figure 10:
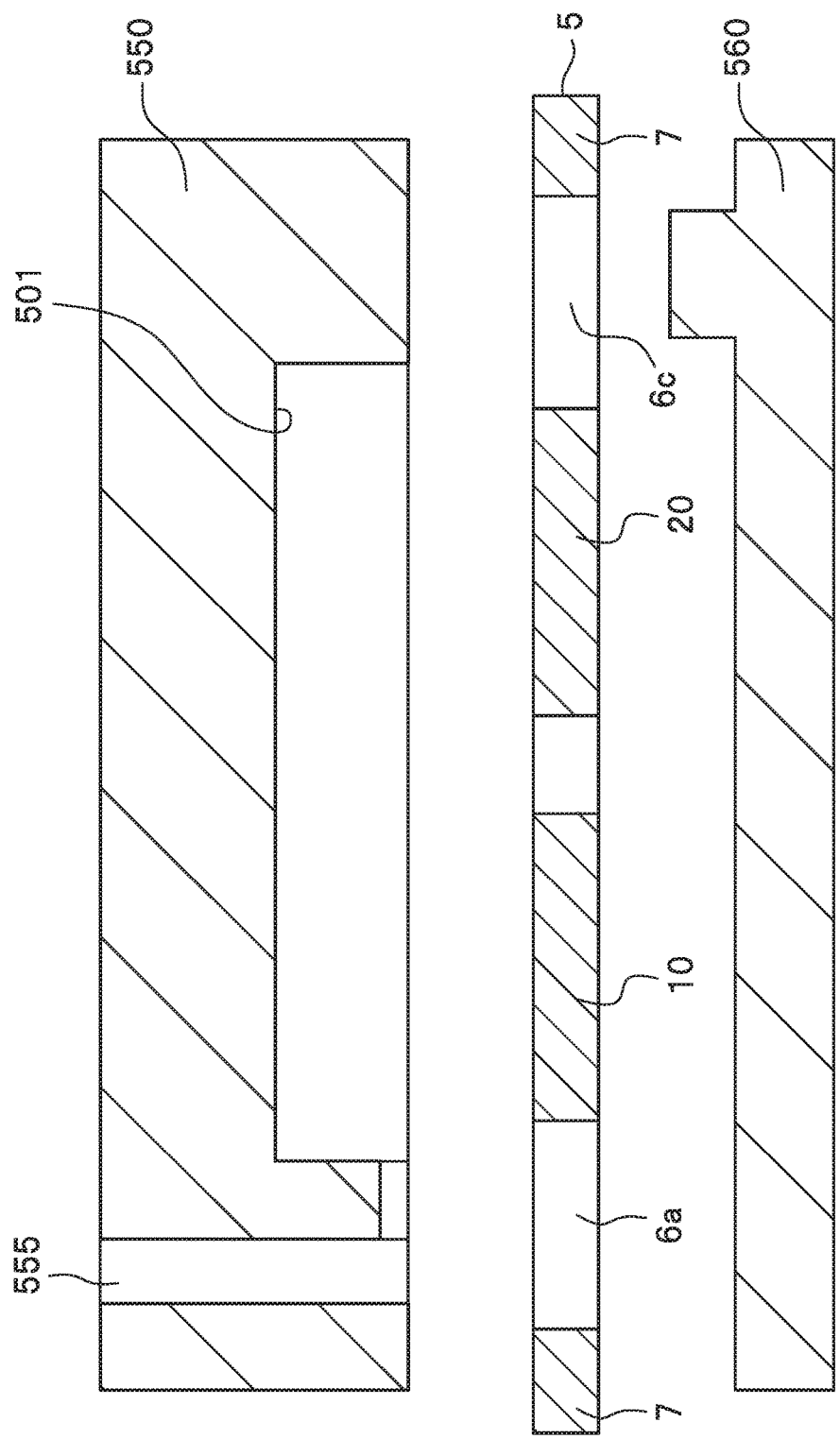
FIG. 10 is a cross-sectional view schematically showing the arrangement of the lead frame and the mold, taken along a line corresponding to the line XIII-XIII in FIG. 11, representing an aspect of a process for manufacturing the package according to the first embodiment.
Figure 11:
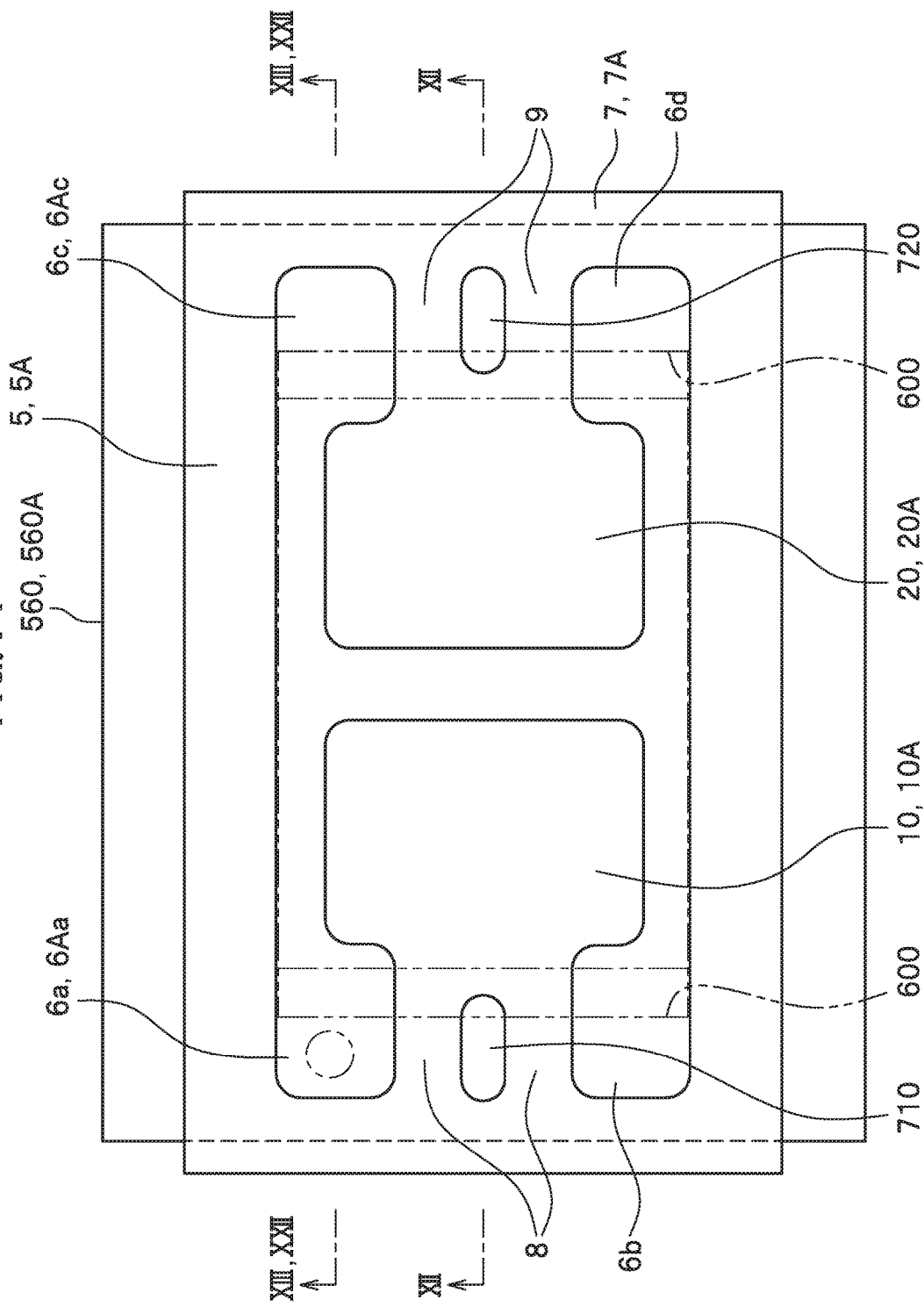
FIG. 11 is a top view of a lead frame, representing an aspect of a process for manufacturing the package according to the first embodiment and a second embodiment.
Figure 12:
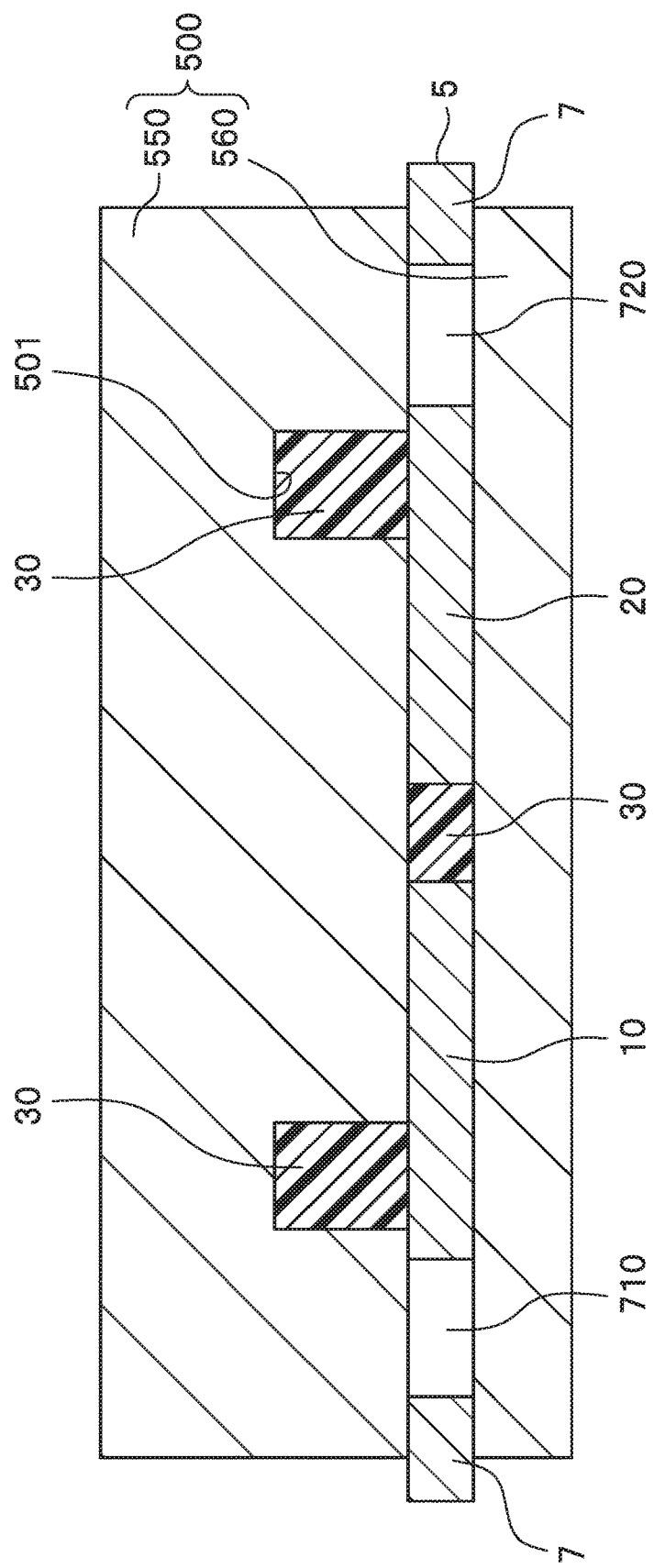
FIG. 12 is a schematic cross-section of the package and the mold, viewed in a direction corresponding to the direction of the arrows XII-XII in FIG. 11 after a first resin has been injected into the mold, representing an aspect of a process for manufacturing the package according to the first embodiment.
Figure 13:
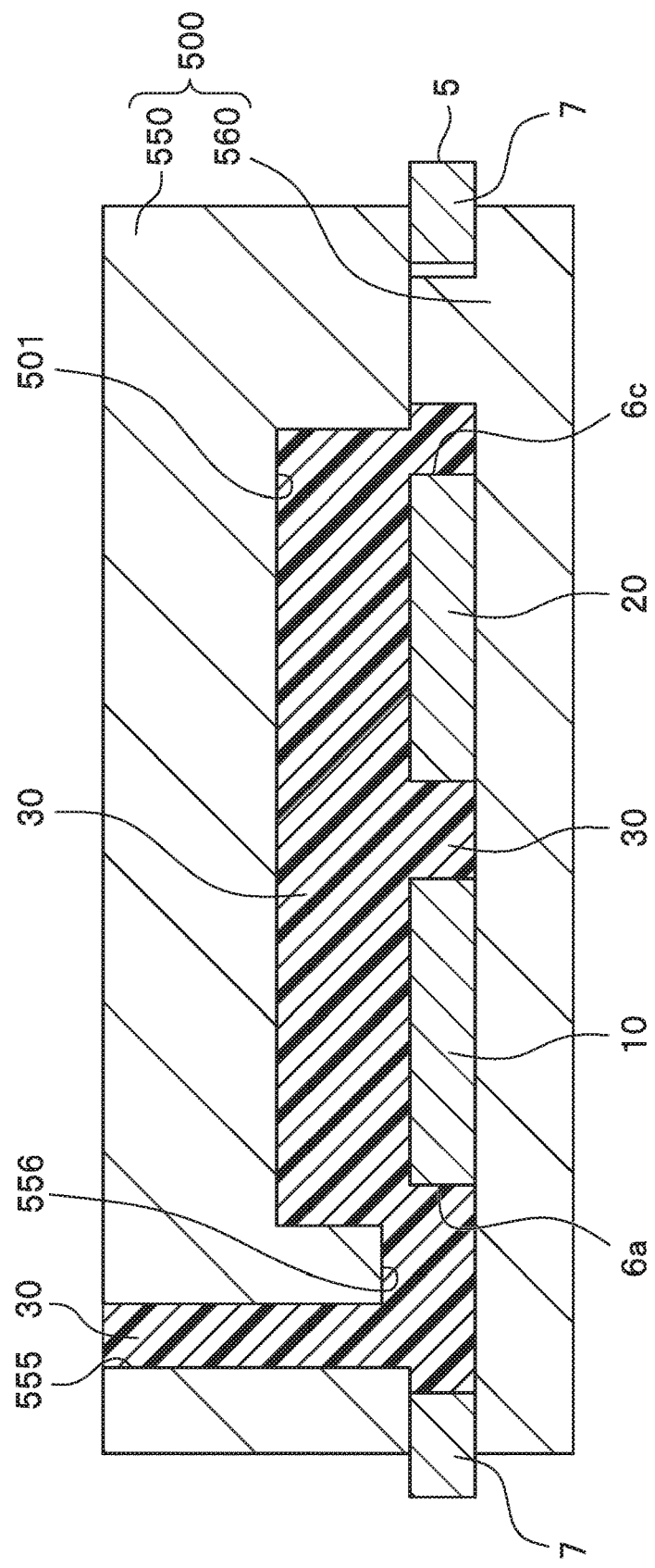
FIG. 13 is a schematic cross-section of the package and the mold, viewed in a direction corresponding to the direction of the arrows XIII-XIII in FIG. 11 after the first resin has been injected into the mold, representing an aspect of a process for manufacturing the package according to the first embodiment.
Figure 14:
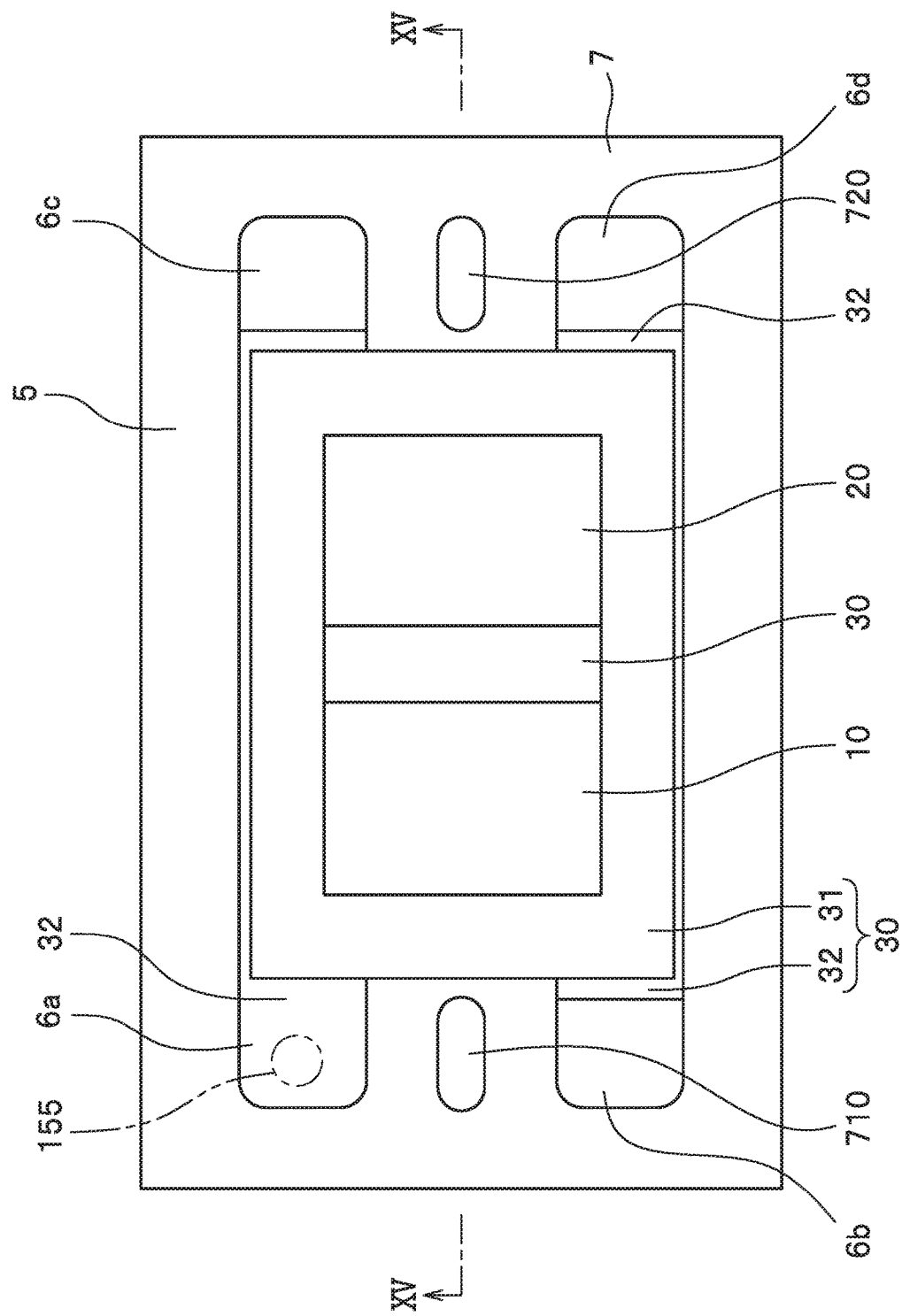
FIG. 14 is a schematic plan view of a cured or solidified package, representing an aspect of a process for manufacturing the package according to the first embodiment.
Figure 15:
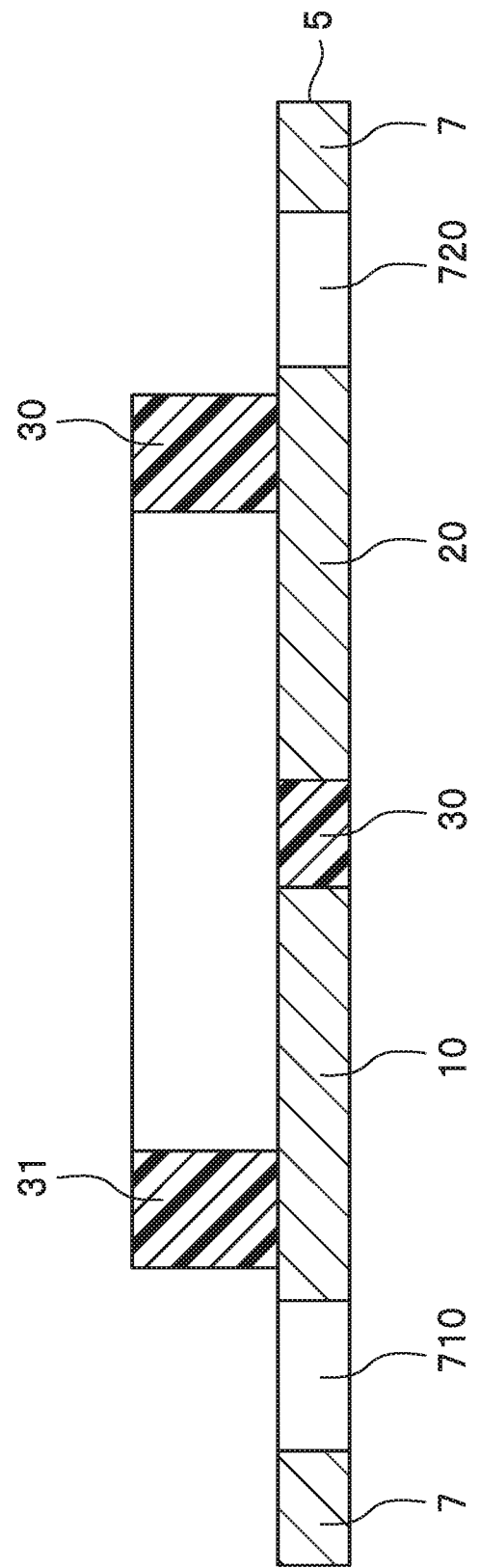
FIG. 15 is a schematic cross-section of the package, viewed in the direction of the arrows XV-XV in FIG. 14, representing an aspect of a process for manufacturing the package according to the first embodiment.
Figure 16:
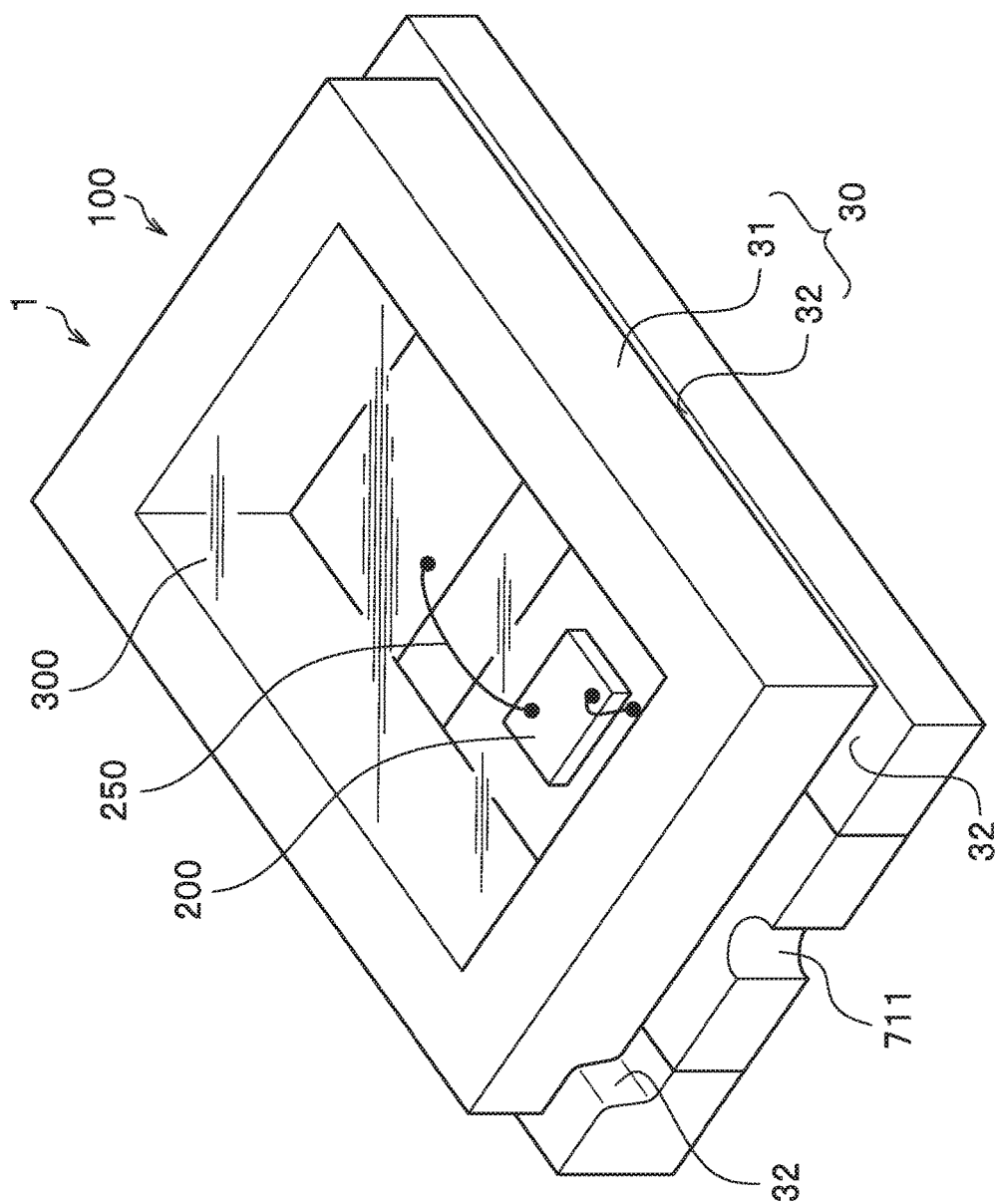
FIG. 16 is a schematic perspective view showing the whole of a light emitting device according to the first embodiment.

Next, a description will be given of a method for manufacturing the package 100 and the light emitting device 1 with reference to FIGS. 7 to 16. FIG. 7 is a plan view of a lead frame. FIG. 8 is a schematic cross-section of the lead frame, viewed in the direction of the arrows VIII-VIII in FIG. 7. FIG. 9 is a cross-sectional view schematically showing the arrangement of the lead frame and a mold, taken along a line corresponding to the line XII-XII in FIG. 11. FIG. 10 is a cross-sectional view schematically showing the arrangement of the lead frame and the mold, taken along a line corresponding to the line XIII-XIII in FIG. 11. FIG. 11 is a top view of the lead frame. In FIG. 11, the lead frame is sandwiched between an upper mold and a lower mold, and seen through part of these molds for the sake of illustration. FIG. 12 is a cross-section of the package and the mold, viewed in a direction corresponding to the direction of the arrows XII-XII in FIG. 11 after a first resin has been injected into the mold. FIG. 13 is a cross-section of the package and the mold, viewed in a direction corresponding to the direction of the arrows XIII-XIII in FIG. 11 after the first resin has been injected into the mold. FIG. 14 is a plan view of a cured or solidified package, in which the first electrode and the second electrode have been electroplated. FIG. 15 is a cross-section of the package, viewed in the direction of the arrows XV-XV in FIG. 14. FIG. 16 is a perspective view showing the whole of a light emitting device.

A method for manufacturing a package according to the first embodiment has the following steps of (1) to (4).

(1) Preparing a Lead Frame

A lead frame to be prepared in this step is a lead frame 5 having a package formation region 600 in which a first electrode 10 and a second electrode 20, which is to be separated from the first electrode 10 in the package, are arranged. Specifically, the lead frame 5 has a frame 7, the first electrode 10, the second electrode 20, a first connecting portion 8 connecting between the frame 7 and the first electrode 10, and a second connecting portion 9 connecting between the frame 7 and the second electrode 20. The lead frame 5 has a first through-hole 710 located between the first electrode 10 and the first connecting portion 8 and has a second through-hole 720 located between the second electrode 20 and the second connecting portion 9. The lead frame 5 is in a flat shape and has a through-opening section.

The through-opening section of the lead frame 5 includes a gap between the first electrode 10 and the second electrode 20. Preferably, the width of this gap is the same as or wider than the thickness of the lead frame 5. Each of the first electrode 10 and the second electrode 20 has a rounded, approximately rectangular portion and a portion narrower than the width of the approximately rectangular portion. The first connecting portion 8 of the lead frame 5 has a width approximately the same as that of the narrower portion of the first electrode 10, and is connected to the first electrode outside of the package formation region 600. Similarly, the second connecting portion 9 of the lead frame 5 has a width approximately the same as that of the narrower portion of the second electrode 20, and is connected to the second electrode outside of the package formation region 600. The opening of the lead frame 5 is formed by punching out, cutting off, etching or the like. The package formation region 600 corresponds to a region enclosed by the perimeter of the bottom of a completed package 100, which has been molded and separated from the lead frame 5. The separation of the completed package 100 from the lead frame 5 means that the first electrode 10 and the second electrode 20 are separated from the frame 7, i.e., the first electrode 10 is separated from the first connecting portion 8 and the second electrode 20 is separated from the second connecting portion 9. The first electrode 10 in the lead frame 5 corresponds to the first electrode 10 in a singulated, completed package. Likewise, the second electrode 20 in the lead frame 5 corresponds to the second electrode 20 in a singulated, completed package. For simplicity, the lead frame 5 will be described to have one package formation region 600 for one package. However, a plurality of package formation regions 600 may be prepared in one lead frame 5.

The lead frame 5 is a plate-like member and has a through-opening section of a predetermined shape formed around the first electrode 10 and the second electrode 20 such that an end of the first electrode 10 and an end of the second electrode 20 are facing and spaced apart from each other. The lead frame 5 has a frame 7 that surrounds the first electrode 10 and the second electrode 20.

The first electrode 10 has a portion corresponding to the first outer lead portion 11 of a package, which is formed when the package is formed and which is currently connected through the first connecting portion 8 to the frame 7. The through-opening section formed in the lead frame 5 includes a first through-opening 6a and a second through-opening 6b respectively located adjacent to both sides of the first electrode 10 or the first connecting portion 8.

Incidentally, in the first embodiment, the first resin 30 is injected from the first through-opening 6a as described later.

The second electrode 20 has a portion corresponding to the second outer lead portion 21 of a package, which is formed when the package is formed and which is currently connected through the second connecting portion 9 to the frame 7. The through-opening section formed in the lead frame 5 includes a third through-opening 6c and a fourth through-opening 6d respectively located adjacent to both sides of the second electrode 20 or the second connecting portion 9.

(2) Placing the Lead Frame in a Mold.

In a step of placing the lead frame in a mold, the first electrode 10 and the second electrode 20 of the lead frame 5 are sandwiched between an upper mold 550 and a lower mold 560, which are vertically separated parts of a mold 500. For convenience of explanation, some figures show a state in which the lower surface of the lead frame 5 and the lower mold 560 are spaced apart from each other. The lead frame 5 is fixed on the upper surface of the lower mold 560 in an actual process.

The lower mold 560 may have convex portions having such sizes as to fit into the second through-opening 6b, the third through-opening 6c, and the fourth through-opening 6d, to fix the lead frame 5. The convex portions provided on the lower mold 560 are made contact with the upper mold 550 to limit the flow of the first resin 30. With this structure, when the first resin 30 has been molded into a form, the first resin 30 has not been filled in the second through-opening 6b, the third through-opening 6c, and the fourth through-opening 6d, and thus those through-openings are preserved and a step for cutting the flange portion 32 can be omitted.

The upper mold 550 of the mold 500 has a recessed portion 501 corresponding to a wall portion 31 which is to be formed with the first resin 30 on the first electrode 10 and the second electrode 20. The first resin 30 is injected into the recessed portion 501 provided in the upper mold 550. The recessed portion 501 of the upper mold 550 is continuously formed in a ring shape. The upper mold 550 has a through-hole formed outside the recessed portion 501 in plan view, as an inlet 555 for injecting the first resin 30. The lead frame 5 is so tightly sandwiched between the upper mold 550 and the lower mold 560 that the first resin 30 may not go into a gap between the lead frame 5 and the upper mold 550 and a gap between the lead frame 5 and the lower mold 560. If the first resin 30 goes into a gap between the lead frame 5 and the upper mold 550 and a gap between the lead frame 5 and the lower mold 560, and adheres to a region of the surface of the lead frame 5 on which region a light emitting element is to be mounted, a burr trimming process is required.

(3) Injecting the First Resin into the Mold for Molding

The upper mold 550 of the mold 500 has the inlet 555 located outside the package formation region 600. The inlet 555 of the upper mold 550 is formed at a location corresponding to the first through-opening 6a of the lead frame 5. The inlet 555 is formed outside the first electrode 10, on one side near the frame 7. The first resin 30 injected through the inlet 555 may have been blended with a light reflecting material prior to the injection.

In this injection step, the first resin 30 is injected through the inlet 555, which is located adjacent to the first outer lead portion 11 of the first electrode 10 in plan view, into the mold 500 in which the lead frame 5 is sandwiched between the upper mold 550 and the lower mold 560.

The prepared lead frame 5 has the first through-opening 6a formed adjacent to the first electrode 10 or the first connecting portion 8. The first resin is injected through the through-opening 6a. The first resin 30 injected from the inlet 555 passes through the first through-opening 6a of the lead frame 5, and goes into the recessed portion 501 of the upper mold 550. In this embodiment, the upper mold 550 has only one inlet 555. However, the upper mold 550 may have a plurality of inlets 555. Although the inlet 555 is formed in the upper mold 550, an inlet may be formed in the lower mold 560 to allow the first resin 30 to be injected from the inlet of the lower mold.

The mold 500 in which the lead frame 5 is sandwiched between the upper mold 550 and the lower mold 560 constitutes a hollow space including the first through-opening 6a, to which hollow space the inlet 555 is provided. The hollow space constitutes an inlet 556 into the recessed portion 501 with an opening whose span is larger than the thickness of the first outer lead portion 11. Since the inlet 556 opens toward the recessed portion 501 with the opening larger than the thickness of the first outer lead portion 11, a first resin 30 with high viscosity is efficiently injected into the mold 500. For example, a first resin 30 in which a large number of particles of a light reflecting material are dispersed has an increased viscosity. The first resin 30 with high viscosity may not be efficiently injected into the mold 500 if the inlet 556 is small. So the large inlet 556 enables the first resin 30 with high viscosity to be efficiently injected into the mold 500. In general, a thermoplastic resin has higher viscosity than a thermosetting resin, and thus it is very effective to provide a large inlet when using a thermoplastic resin. In addition, a resin used in injection molding has higher viscosity than a resin used in transfer molding, and thus it is very effective to provide the large inlet 556 when using injection molding.

For the step of injecting the first resin 30, a known molding method such as injection molding, transfer molding, or extrusion molding may be used.

The first resin 30 thus injected into the mold 500 is cured or solidified to form a wall portion 31 corresponding to the recessed portion 501 of the upper mold 550, which is the upper one of the vertically-separated molds of mold 500. A flange portion 32 is also formed so as to project from outer sides of the wall portion 31. The mounting area of the first resin 30 is increased by forming the flange portion 32. This improves stability of the mounting of the package.

For example, when the first resin 30 is a thermoplastic resin such as a polyphthalamide resin, the resin can be molded by injection molding. In general, a thermoplastic resin has higher viscosity than a thermosetting resin, and thus is suitable to injection molding. Therefore, it is preferable to have a large inlet for injecting the resin. The thermoplastic resin to be injected into the mold 500 is heated to a molten state, and then injected into a low temperature mold 500 to be solidified by cooling. Moreover, a thermoplastic resin in general has higher viscosity than a thermosetting resin, and, when the thermoplastic resin is blended with a particulate light reflecting material at high concentration to have high light reflectivity, has a further increased viscosity. Therefore, it is preferable to provide a larger inlet. A large inlet enables a high-concentrated first resin 30 to be injected into the mold 500. This enables to blend a light reflecting material into the first resin 30 at high concentration, increase the concentration of the light reflecting material contained in the wall portion 31, and thereby increase the light reflectivity of the wall portion 31. This provides a package with high light reflectivity.

Conventionally, an inlet is provided at bottom surface of each package and thus the package has a large thickness, which leads to difficulty in producing a thin-profile package. In contrast, as to the package according to the present embodiment, the inlet 556 is provided to a hollow space adjacent to the first outer lead portion 11. This enables production of a thin-profile package.

(4) Cutting the Lead Frame

The lead frame 5 is cut while preserving at least a part of the flange portion 32. The package 100 is singulated by this step into a product.

Specifically, after the first resin 30 is cured or solidified, an injection flow mark 155 of the first resin 30 is removed from a portion of the first resin 30 adjacent to the first electrode 10, and the lead frame 5 is cut, to singulate the package 100.

The cutting of the lead frame 5 can be performed in a single operation, or divided into a plurality of operations. Cutting the lead frame 5 in a single operation enables making the cut surface of the first outer lead portion 11 flush with the cut surface of the flange portion 32 in plan view. The cut surface of the first outer lead portion 11 being flush with the cut surface of the flange portion 32 improves adhesion between the first outer lead portion 11 and the flange portion 32. Since there is no step between the first outer lead portion 11 and the flange portion 32, unsmoothness occurring in the mounting of the package is eliminated, leading to high mounting accuracy.

Although the part of the flange portion 32 formed in the hollow space into which the first resin 30 is injected has a thickness larger than the thickness of the lead frame 5, the flange portion 32 has a thickness equal to or smaller than the thickness of the lead frame 5 at other parts. Thus, the cutting of the first outer lead portion 11 and the flange portion 32 is easily performed.

The steps of (1) to (4) produce a completed package 100.

Configuration of Light Emitting Device 1

Next, description will be given of a light emitting device 1 with reference to FIG. 16. FIG. 16 is a schematic perspective view showing the whole of a light emitting device according to the first embodiment.

The light emitting device 1 has a package 100, a light emitting element 200, wires 250, and a second resin 300. The light emitting element 200 is mounted on the second electrode 20 of the package 100. The light emitting element 200 is not limited to a specific shape and size. The emission color of the light emitting element 200 can be of any wavelength depending on the use. For example, as a blue light emitting element emitting light having a wavelength between 430 to 490 nm, a nitride semiconductor may be used. The light emitting device 1 may be provided with a protective element, and the protective element may be covered by the second resin 300.

The wires 250 are a electrically-conductive wiring lines that electrically connect electronic components such as the light emitting element 200 or protective elements with the first electrode 10 or the second electrode 20. Examples of the material for the wires 250 include a metal such as gold, silver, copper, platinum, aluminum, and an alloy of these. In particular, gold, which has a good thermal conductivity, is preferably used. The thicknesses of the wires 250 are not limited to a specific thickness and are appropriately determined in accordance with the intended use.

The second resin 300 encapsulates the light emitting element 200 and the like mounted in the package 100. The second resin 300 protects the light emitting element 200 and the like from an external force, dust, moisture, and the like and provides good heat resistance, weather resistance, and light resistance to the light emitting element 200 and the like. Examples of the material for the second resin 300 include a thermosetting resin, such as a silicone resin, an epoxy resin, and a urea resin, which are transparent. In addition to those materials, the second resin 300 may contain a filler such as a phosphor or a material with a high light reflectivity, to have a predetermined function.

By, for example, mixing a phosphor into the second resin 300, the color tone of the light emitting device 1 may be easily adjusted. As the phosphor, a phosphor which has a specific gravity heavier than that of the second resin 300 and which absorbs light from the light emitting element 200 and performs wavelength conversion may be used. A phosphor having a specific gravity heavier than that of the second resin 300 is preferable because the phosphor is sedimented toward the first electrode 10 and the second electrode 20.

Specifically, examples of such a phosphor include a yellow phosphor such as YAG ($Y_3Al_5O_{12}$:Ce) and silicate, and a red phosphor such as CASN ($CaAlSiN_3$:Eu) and KSF ($K_2SiF_6$:Mn).

Preferably, as the filler to be contained in the second resin 300, a substance with high light reflectivity such as $SiO_2$, $TiO_2$, $Al_2O_3$, $ZrO_2$, and MgO may be used. Organic or inorganic coloring pigment and/or coloring dye may be used for the purpose of cutting off light outside a desired range of wavelengths.

Method for Manufacturing Light Emitting Device 1

First Method for Manufacturing Light Emitting Device 1

A first method for manufacturing the light emitting device 1 is comprised of mounting a light emitting element 200 on the first electrode 10 or the second electrode 20 of the package 100, after or before the step (4) in the manufacturing process of the package 100. Here, "before the step (4)" means that the light emitting element 200 is mounted on the first electrode 10 or the second electrode 20 of the package 100 that has not been separated from the lead frame 5 yet.

The light emitting element 200 is of a single-sided electrode structure having an upper surface on which a pair of an n-electrode and a p-electrode is formed. In this case, the light emitting element 200 has an under surface bonded to the first electrode 10 by an insulating dye bonding member and has an upper surface having two electrodes, one of which is connected through a wire 250 to the first electrode 10 and the other of which is connected through wire 250 to the second electrode 20.

Subsequently, the second resin 300 is applied into the recessed portion surrounded by the wall portion 31 of the first resin 30 of the package 100, to seal the light emitting element 200. In this process, the second resin 300 is dripped into the recessed portion of the first resin 30 to fill the recessed portion of the first resin 30 up to the upper surface thereof. Examples of the method for filling the recessed portion of the first resin 30 with the second resin 300 include: dripping, discharging, compression, and extrusion. Of these, dripping is preferable because air remaining in the recessed portion of the first resin 30 is effectively discharged.

Second Method for Manufacturing Light Emitting Device 1

In the first method for manufacturing the light emitting device 1, the light emitting element 200 is mounted on the first electrode 10 or the second electrode 20 of the package 100 and then the package 100 is singulated. In contrast, in the second manufacturing method, the light emitting element 200 may be mounted in the package 100 after the step of singulating the package 100. In other words, the light emitting element 200 is mounted in the singulated package 100.

Package and Light Emitting Device According to Second Embodiment

Figure 17:
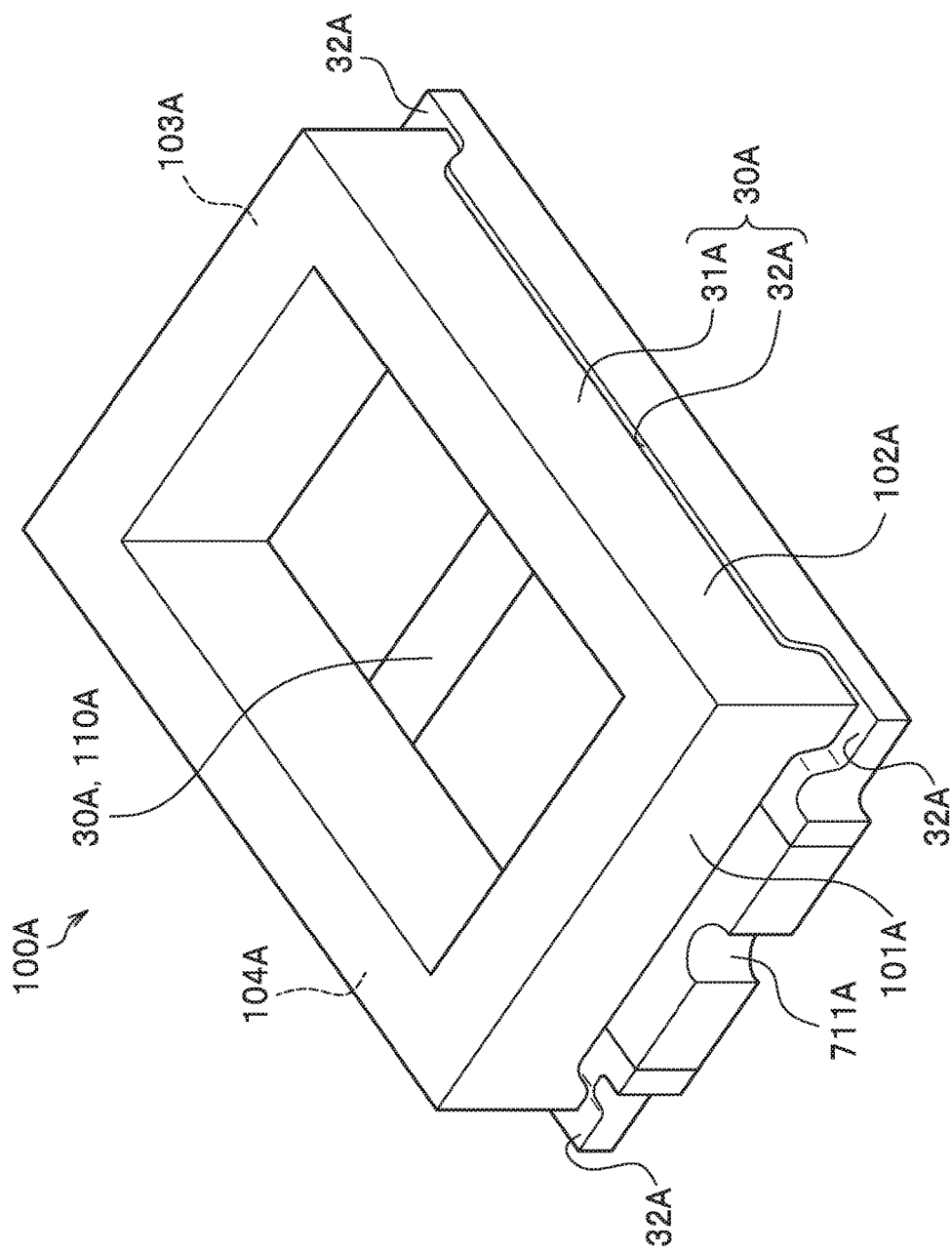
FIG. 17 is a schematic perspective view showing the whole of a package according to a second embodiment of the present disclosure.
Figure 18:
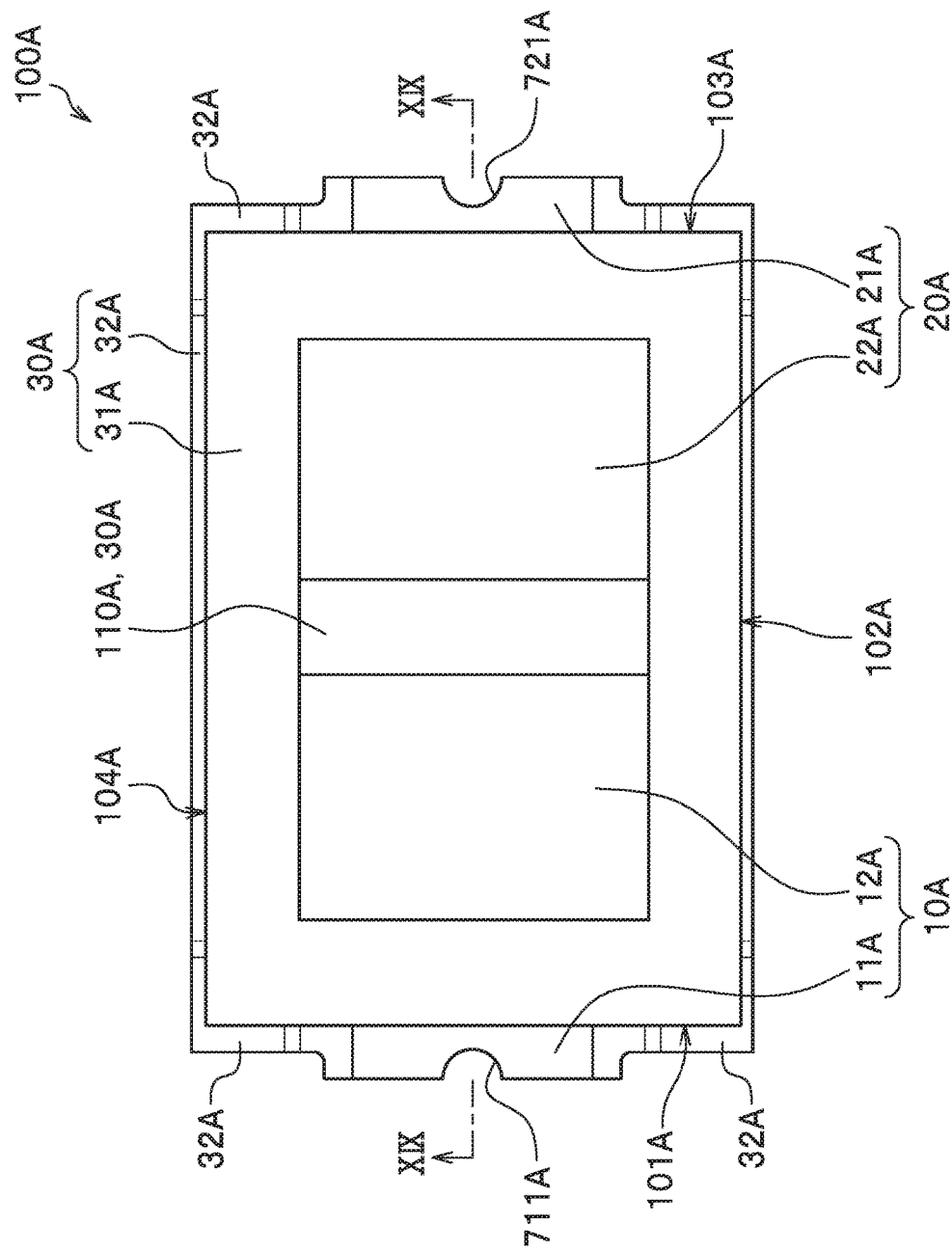
FIG. 18 is a schematic top view of the package according to the second embodiment.
Figure 19:
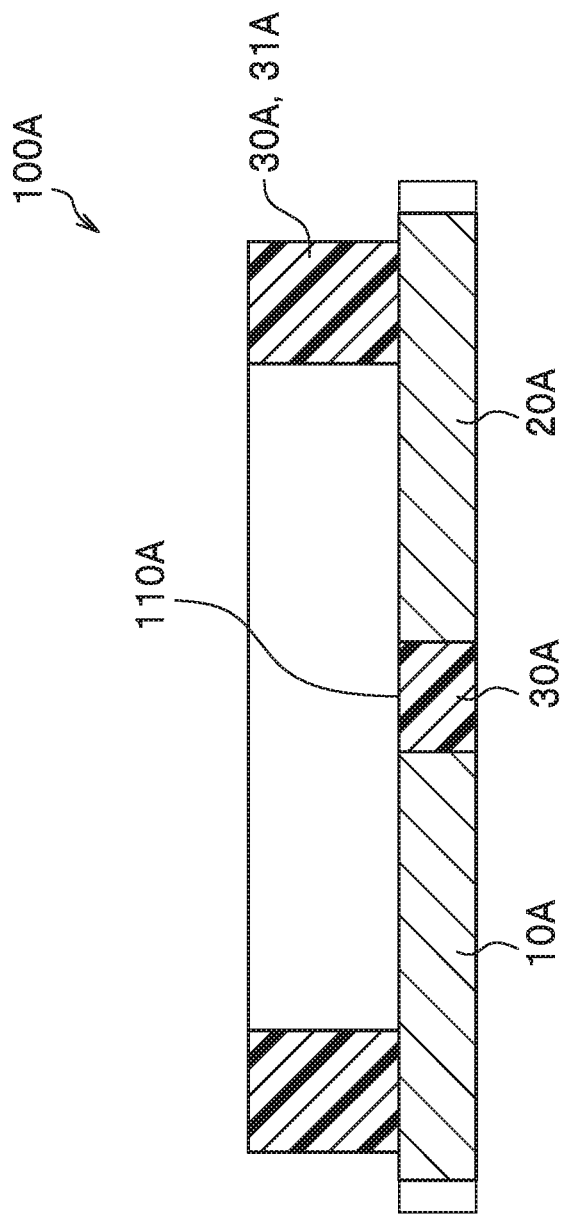
FIG. 19 is a schematic cross-section of the package according to the second embodiment, viewed in the direction of the arrows XIX-XIX in FIG. 18.
Figure 20:
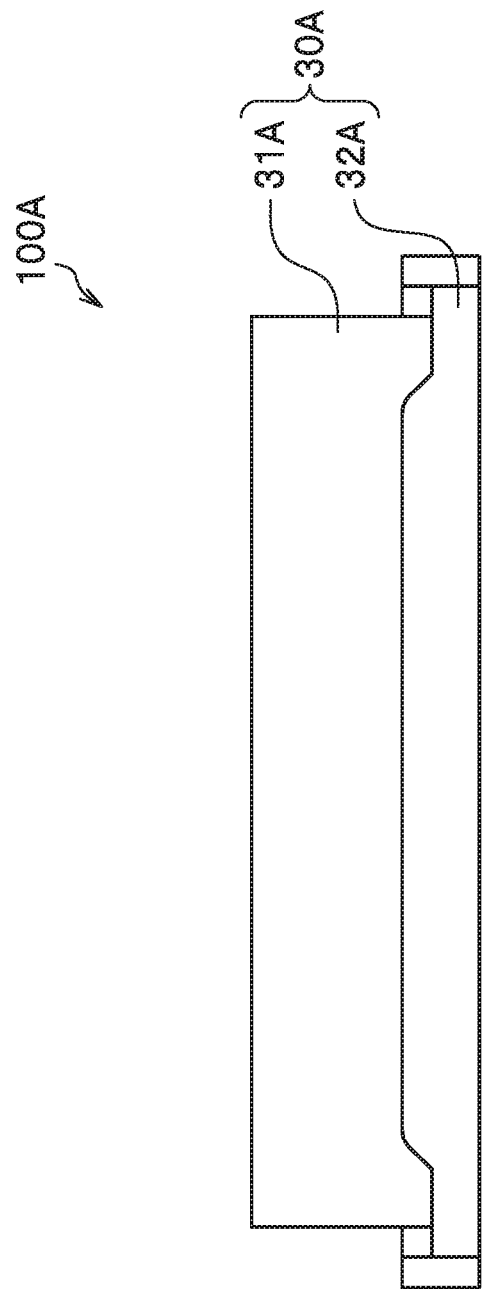
FIG. 20 is a schematic side view of the package according to the second embodiment.
Figure 21:
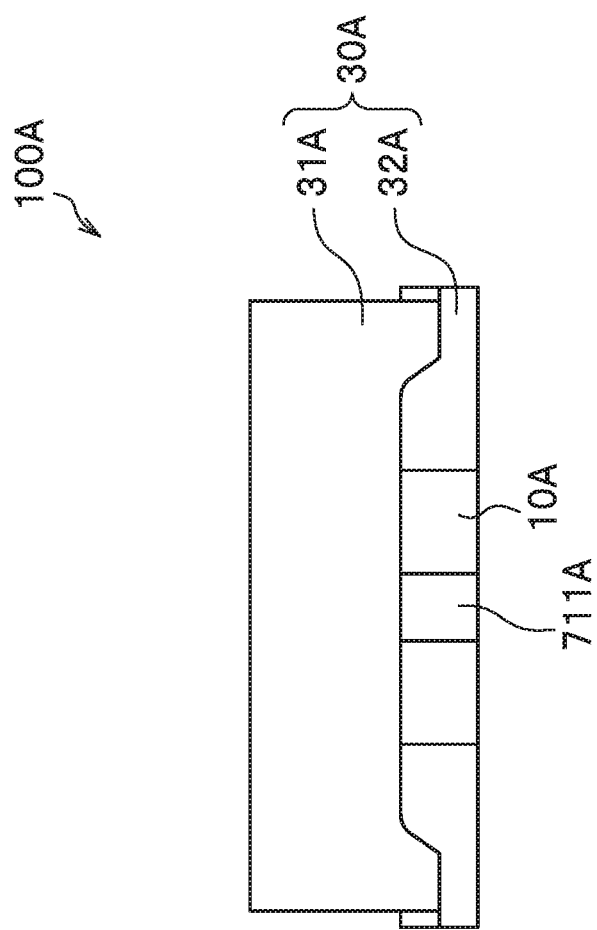
FIG. 21 is a schematic side view of the package according to the second embodiment.
Figure 22:
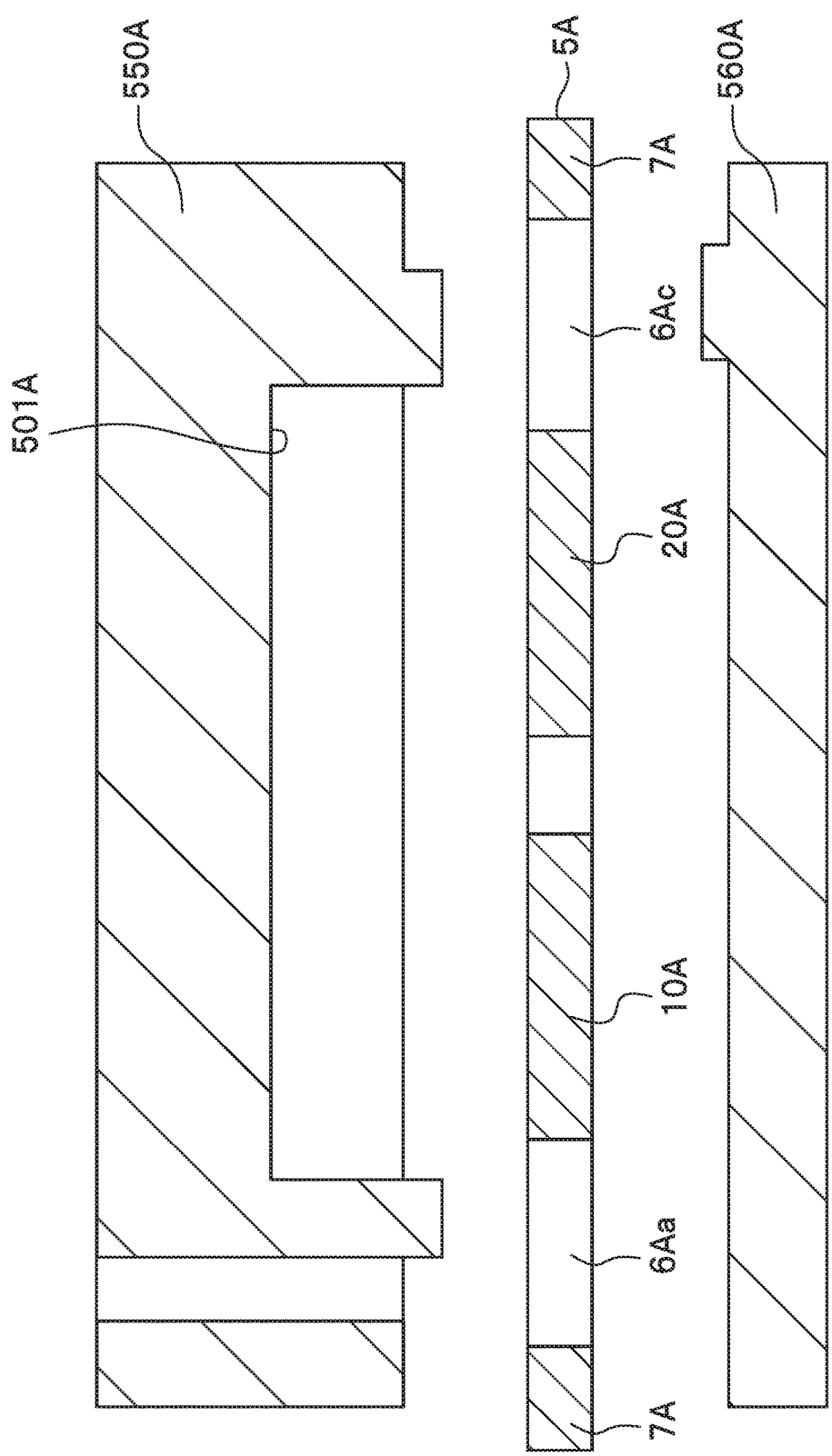
FIG. 22 is a cross-sectional view schematically showing the arrangement of the a lead frame and a mold, taken along a line corresponding to the line XXII-XXII in FIG. 11, representing an aspect of a process for manufacturing the package according to the second embodiment.
Figure 23:
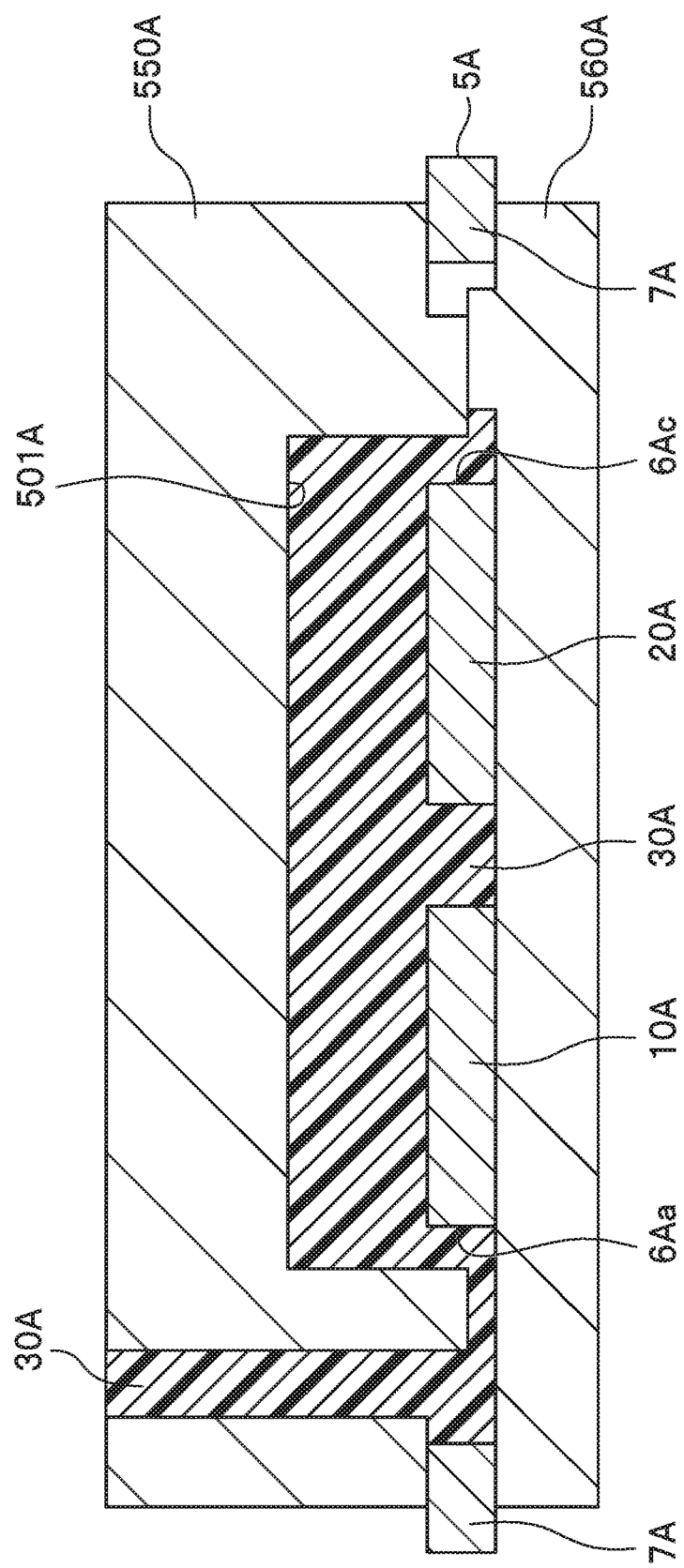
FIG. 23 is a schematic cross-section of the package and the mold, viewed in a direction corresponding to the direction of the arrows XXII-XXII in FIG. 11 after a first resin has been injected into the mold, representing an aspect of a process for manufacturing the package according to the second embodiment.

Description will be given of a package and a light emitting device according to a second embodiment with reference to drawings. FIG. 11 is a top view of a lead frame. In FIG. 11, the lead frame is sandwiched between an upper mold and a lower mold, and seen through part of these molds for the sake of illustration. FIG. 17 is a perspective view showing the whole of the package. FIG. 18 is a top view of the package. FIG. 19 is a cross-section of the package, viewed in the direction of the arrows XIX-XIX in FIG. 18. FIG. 20 is a side view of the package. FIG. 21 is a side view of the package. FIG. 20 is a side view showing a longer side of the package, whereas FIG. 21 is a side view showing a shorter side of the package. FIG. 22 is a cross-sectional view schematically showing the arrangement of the lead frame and a mold, taken along a line corresponding to the line XXII-XXII in FIG. 11. FIG. 23 is a cross-section of the package, viewed in a direction corresponding to the direction of the arrows XXII-XXII in FIG. 11 after a first resin has been injected into the mold. Description will be given of a package and a light emitting device according to the second embodiment in such a way that description of some configurations employing approximately the same configuration as the package and light emitting device according to the first embodiment will be omitted where necessary.

A package 100A is in an approximately rectangular prism as a whole, in which a bottomed recess 110A is formed. The package 100A has a first electrode 10A, a second electrode 20A, and a first resin 30A.

The first electrode 10A and the second electrode 20A respectively have the same configuration as the first electrode 10 and the second electrode 20 in the first embodiment. For example, the first electrode 10A has a first outer lead portion 11A, a first inner lead portion 12A, and a first notch 711A, which respectively have the same configuration as the first outer lead portion 11, the first inner lead portion 12, and the first notch 711 of the first electrode 10. Likewise, the second electrode 20A has a second outer lead portion 21A, a second inner lead portion 22A, and a second notch 721A, which respectively have the same configuration as the second outer lead portion 21, the second inner lead portion 22, and the second notch 721 of the second electrode 20.

The first resin 30A has a wall portion 31A and a flange portion 32A. The flange portion 32A has a part having a thickness different from the thickness of a first outer lead portion 11A. The flange portion 32A has a predetermined width extending outwardly from the wall portion 31A at both sides of the first outer lead portion 11A in plan view. The predetermined width ranges from approximately the same width of the first outer lead portion 11A to a width shorter than that of the first outer lead portion 11A. The flange portion 32A has the same width as that of the first outer lead portion 11A at a portion immediately adjacent thereto, and has the width shorter than that of the first outer lead portion 11A at a portion slightly spaced away therefrom.

The flange portion 32A of the first resin 30A projects outwardly from the wall portion 31A in plan view. The flange portion 32A has parts formed adjacent to the first outer lead portion 11A located at a first outer side 101A and has parts formed adjacent to the second outer lead portion 21A located at a third outer side 103A. At least one of the parts of the flange portion 32A which are respectively formed adjacent to the both sides of the first outer lead portion 11A has a thickness different from the thickness of the first outer lead portion 11A.

In this embodiment, the flange portion 32A has parts located adjacent to both sides of the first outer lead portion 11A, which parts have a thickness smaller than that of the first outer lead portion 11A. Preferably, the parts of the flange portion 32A respectively located adjacent to the first outer lead portion 11A each have a thickness of 0.5 to 0.8 times the thickness of the first outer lead portion 11A. More preferably, the parts of the flange portion 32A respectively located adjacent to the first outer lead portion 11A each have a portion having a thickness of 0.5 to 0.8 times the thickness of the first outer lead portion 11A and a portion having the same thickness as the thickness of the first outer lead portion 11A. More preferably, the parts of the flange portion 32A located adjacent to the first outer lead portion 11A each have a portion having a thickness of equal to or less than 0.7 times the thickness of the first outer lead portion 11A.

Preferably, the parts of the flange portion 32A located adjacent to the first outer lead portion 11A each have a thickness of 0.005 to 0.3 times the height of the wall portion 31A, and more preferably a thickness of 0.01 to 0.2 times the height of the wall portion 31A. The flange portion 32A having predetermined limited thicknesses enables uniform thermal storage over the four sides of the first resin 30A. The flange portion 32A may have a part located at the corner between the first outer side 101A and the fourth outer side 104A, which part has a thickness different from, in this embodiment a thickness smaller than, the thicknesses of the parts of the flange portion 32A which are located at corners between the first outer side 101A and the second outer side 102A, between the second outer side 102A and the third outer side 103A, and between the third outer side 103A and the fourth outer side 104A. The part of the flange portion 32A located at the corner between the first outer side 101A and the fourth outer side 104A may have a thickness smaller than the thickness of a part of the flange portion 32A located along the fourth outer side 104A.

The thinner part of the flange portion 32A thus formed may be used as a cathode mark or an anode mark.

Preferably, the parts of the flange portion 32A which have a thickness smaller than the thickness of the first outer lead portion 11A each have a width shorter than the width of the first outer lead portion 11A. This is because the parts of the flange portion 32A which have a thickness smaller than the thickness of the first outer lead portion 11A are susceptible to chipping.

The flange portion 32A has parts respectively located adjacent to both sides of the second outer lead portion 21 at the third outer side 103A. Alternatively, the flange portion 32A may have a part located adjacent to at least one of the both sides of the second outer lead portion 21A at the third outer side 103A. The flange portion 32A also has parts located respectively along the second outer side 102A and the fourth outer side 104A. Alternatively, the flange portion 32A may have either of those parts. It is preferable that the width of the part of the flange portion 32A located along the second outer side 102A be approximately the same as the width of the part of the flange portion 32A located along the fourth outer side 104A. This is because this configuration brings stability to the package due to a good balance. It is preferable that the widths of the parts of the flange portion 32A respectively located at both sides of the first outer lead portion 11A be approximately the same as the width of the part of the flange portion 32A located at the second outer side 102A. This is because a stress exerted on the flange portion 32A is uniformly distributed by making the flange portion 32 have the same width along the outer sides 101A and 102A. One of the parts of the flange portion 32A respectively located at both sides of the first outer lead portion 11A may have a thickness smaller than the thickness of the first electrode 10A, and the other one of the parts of the flange portion 32A respectively located at both sides of the first outer lead portion 11A may have approximately the same thickness as the thickness of the first electrode 10A. This is because a stress exerted on the flange portion 32 is uniformly distributed also by this configuration.

Method for Manufacturing Package 100A

A method for manufacturing a package 100A according to the second embodiment has the same steps as the steps of the method for the manufacturing a package according to the first embodiment, except that an upper mold 550A having a different shape corresponding to the first resin 30A according to the second embodiment is used. In the manufacturing steps of a package according to the second embodiment, a lead frame 5A having the same configuration as the lead frame 5 according to the first embodiment is used. For example, the lead frame 5A has the first electrode 10A, the second electrode 20A, a frame 7A, a first through-opening 6Aa, and a third through-opening 6Ac, which respectively have the same configuration as the first electrode 10, the second electrode 20, the frame 7, the first through-opening 6a, and the third through-opening 6c of the lead frame 5.

The mold in which the lead frame 5A is sandwiched between the upper mold 550A and a lower mold 560A constitutes a hollow space including the first through-opening 6Aa, to which hollow space an inlet is provided in the upper mold 550A. The hollow space constitutes an inlet into a recessed portion 501A formed in the upper mold 550A with an opening whose span is smaller than the thickness of the first outer lead portion 11A. Since the inlet into the recessed portion 501A formed in the upper mold 550A is provided with the opening whose span is smaller than the thickness of the first outer lead portion 11A, a first resin 30A with low viscosity is efficiently injected into the mold. In general, a thermosetting resin has lower viscosity than a thermoplastic resin, and thus it is very effective to provide a small inlet when using a thermoplastic resin. In addition, a resin used in transfer molding has lower viscosity than a resin used in injection molding, and thus it is very effective to provide a small inlet when using transfer molding. When using a liquid-form first resin 30A having low viscosity, the liquid-form first resin 30A is blended with a particulate light reflective material to adjust the viscosity. Even when the amount of the particulate light reflecting material blended in the resin is so small that the viscosity of the resin is not increased to a predetermined viscosity, the small inlet allows the first resin 30A to be formed in a concrete shape.

In the second embodiment, examples of the first resin 30A include a thermosetting resin such as an epoxy resin. In this case, the step of injecting the first resin 30A is performed by transfer molding. In the transfer molding, pellets (tablets) of a thermosetting resin each having a predetermined size are placed in a vessel connected to the upper mold.

When using transfer molding, the lead frame 5A is sandwiched between an upper mold 550A and a lower mold 560A which have been heated. The upper mold 550A has the recessed portion 501A, which corresponds to the wall portion 31A to be formed on the first electrode 10A and the second electrode 20A. The first resin 30A is injected into this recessed portion 501A. A pressure exerted for example by a piston to the predetermined vessel connected to the upper mold 550A causes the thermosetting resin in a melt to be injected as the first resin 30A, through the inlet into the recessed portion 501A of the upper mold 550A. The filled thermosetting resin, i.e., the first resin 30A, is then heated. The thermosetting resin cured by heating forms a concrete shape of the first resin 30A. The thermosetting resin may be cured in one step. However, the thermosetting resin is preferably cured in two steps, in the first one of which the thermosetting resin is tentatively cured in a slightly low heating temperature and in the second one of which the thermosetting resin is finally cured in a high heating temperature. This is because curing in two steps produces a strong first resin. The small inlet enables exerting predetermined pressure to the path communicating from the predetermined vessel to the mold even with a thermosetting resin having low viscosity, and thus facilitates molding.

Package Manufacturing Method According to Third Embodiment

Figure 24:
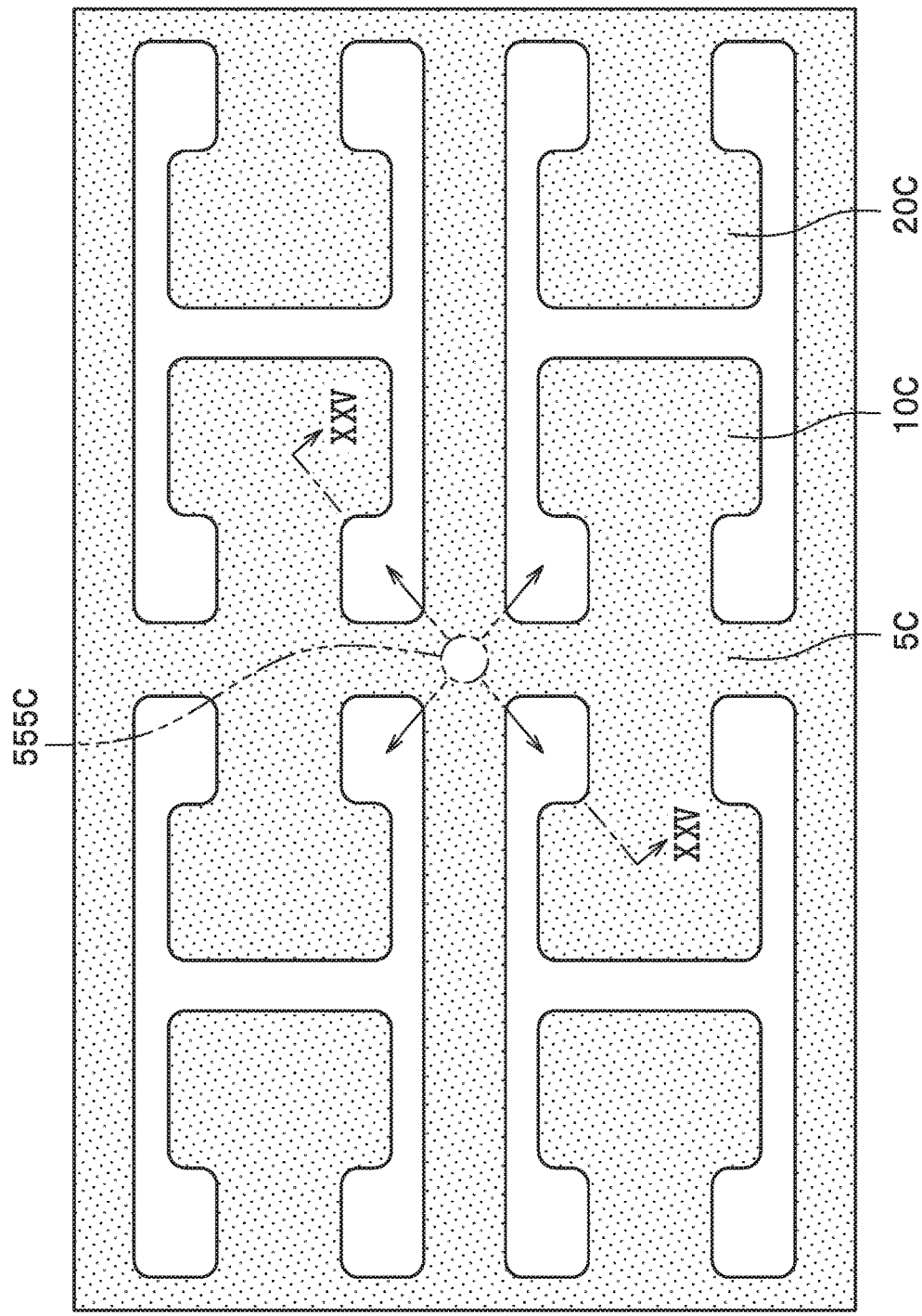
FIG. 24 is a plan view of a lead frame according to a third embodiment of the present disclosure.
Figure 25:
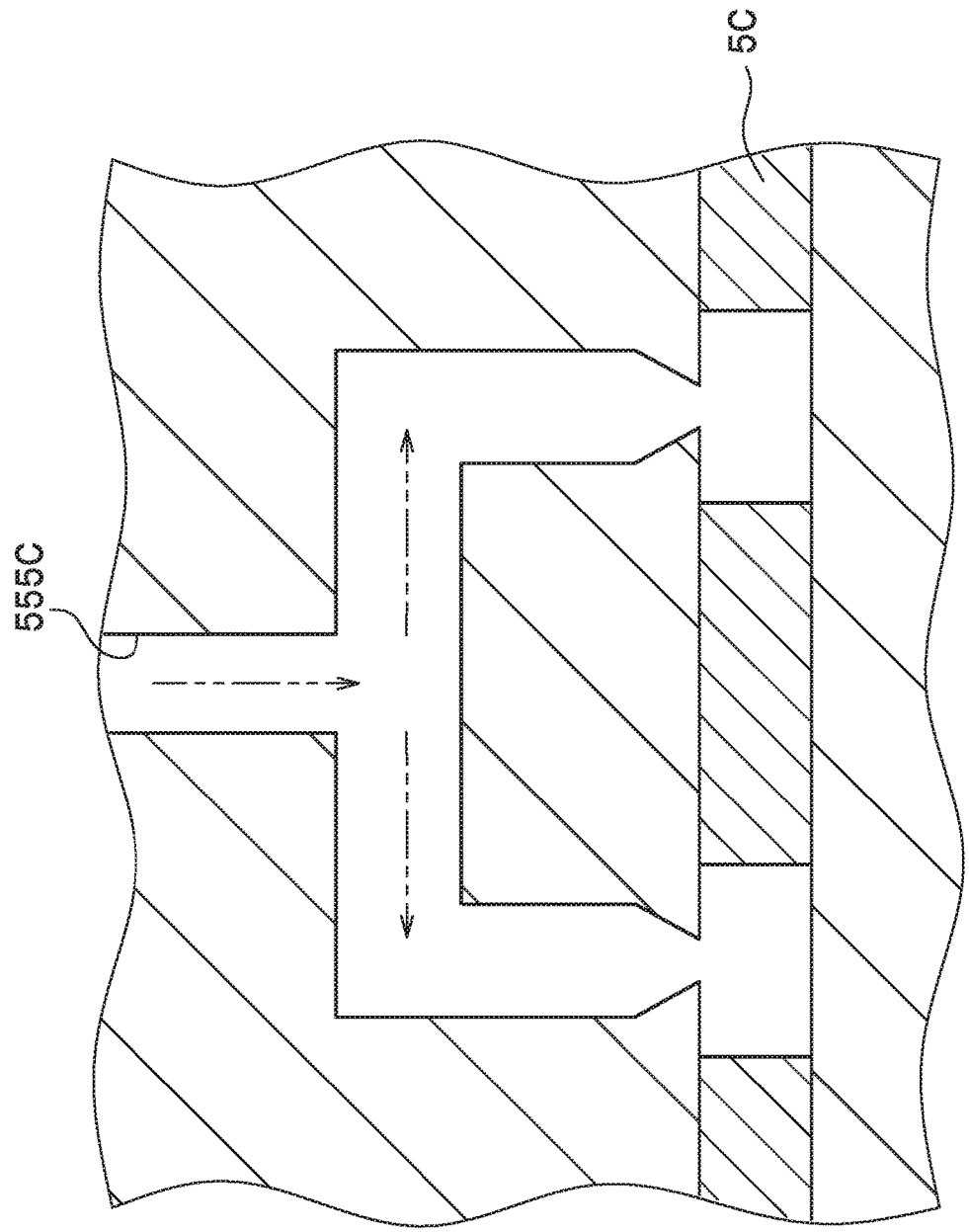
FIG. 25 is a cross-sectional view schematically showing the arrangement of the lead frame and a mold, taken along line XXV-XXV in FIG. 24, representing an aspect of a process for manufacturing the package according to the third embodiment.

Hereinafter, description will be given of a package manufacturing method according to a third embodiment with reference to drawings. FIG. 24 is a plan view of a lead frame according to the third embodiment of the present disclosure. FIG. 25 is a cross-sectional view schematically showing the arrangement of the lead frame and a mold, taken along line XXV-XXV in FIG. 24, representing an aspect of a process for manufacturing the package according to the third embodiment.

A lead frame 5C has four sets of a pair of a first electrode 10C and a second electrode 20C, arranged in 2 columns by 2 rows. A path communicating from a predetermined vessel containing a first resin, through an inlet 555c formed in a mold, to predetermined hollow spaces is branched into four tubes. The arrows in FIG. 24 and FIG. 25 represent flows of the first resin. By making branches of the path communicating from a predetermined vessel to predetermined hollow spaces, the number of the vessels is decreased and thus the manufacturing cost is reduced.

Package and Light Emitting Device According to Fourth Embodiment

Figure 26:
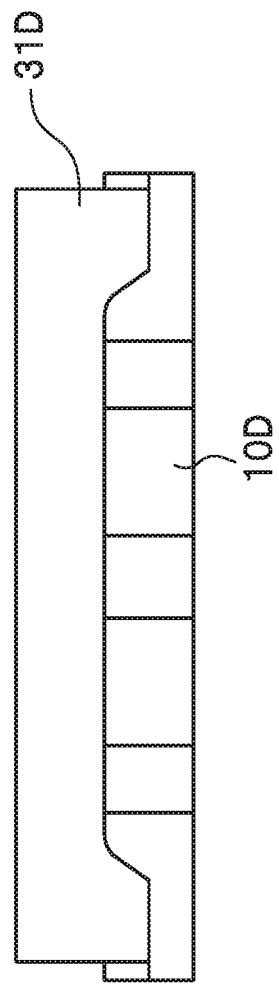
FIG. 26 is a schematic side view showing a package according to a fourth embodiment of the present disclosure.

Description will be given of a package according to a fourth embodiment with reference to drawings. FIG. 26 is a schematic side view showing a package according to the fourth embodiment of the present disclosure.

A package has a first electrode 10D, a second electrode, and a wall portion 31D having a predetermined height. The first electrode 10D and the second electrode have a thickness of about 0.4 to 0.6 times the height of the wall portion 31D of the first resin. By setting the thicknesses of the wall portion 31D to a predetermined thickness, the package may be made in a thin profile. This thin profile may be achieved by lowering the height of the wall portion while preserving the size of the first electrode and the second electrode, or by increasing the thicknesses of the first electrode and the second electrode while preserving the height of the wall portion. The first electrode and the second electrode having a larger thicknesses improve heat dissipation from the light emitting element.

Package and Light Emitting Device According to Fifth Embodiment

Figure 27:
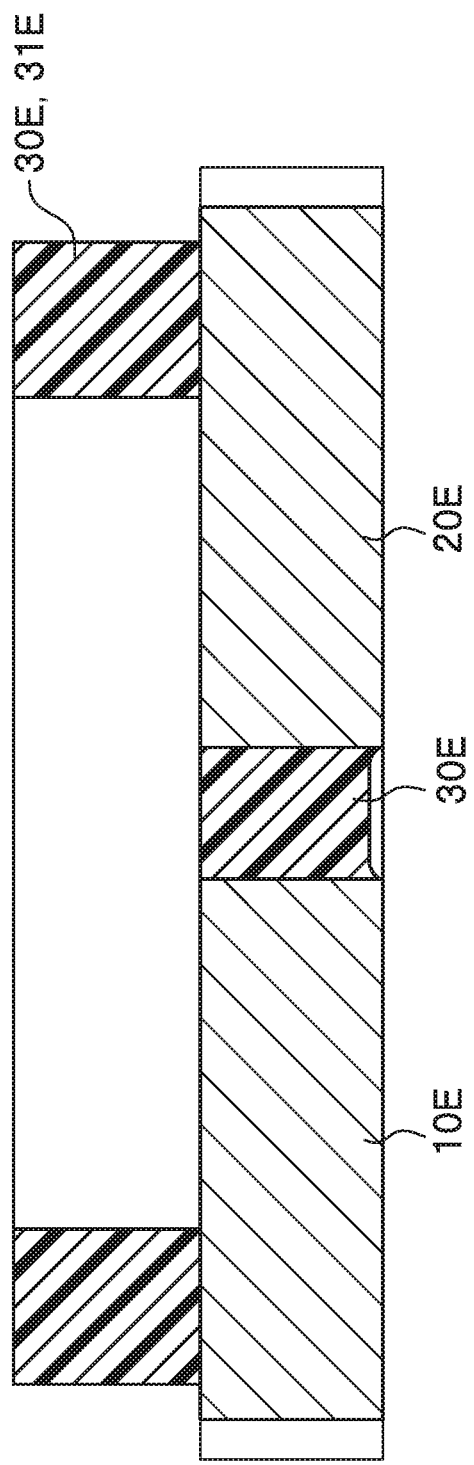
FIG. 27 is a schematic cross-sectional view of a package according to a fifth embodiment.

Description will be given of a package according to a fifth embodiment with reference to drawings. FIG. 27 is a schematic cross-sectional view of a package according to the fifth embodiment.

The package has a first electrode 10E, a second electrode 20E, and a first resin 30E. The first resin 30E has a part between the first electrode 10E and the second electrode 20E and has a part in a wall portion 31E. The part of the first resin 30E between the first electrode 10E and the second electrode 20E has a thickness smaller than that of the first electrode 10E and is hollowed. The first resin 30E thus having an inwardly recessed part effectively prevents short-circuiting between the first electrode 10E and the second electrode 20E.

Variant Embodiment 1

The lead frame 5 shown in FIG. 7 has the first through-opening 6a and the second through-opening 6b respectively located at both sides of the first outer lead portion 11. Two inlets may be respectively provided to this two through-openings to inject the first resin 30.

The upper mold 550 of the mold 500 shown in FIG. 13 has only one single inlet 555. However, upper mold 550 may have two inlets respectively located at both sides of the first electrode 10, and the first resin 30 may be injected from these two inlets.

Moreover, in addition to the inlets located adjacent to the first electrode 10, the upper mold 550 may have one or two more inlets at locations corresponding to both sides of the second electrode 20, and the first resin 30 may also be injected from these inlets.

Those inlets each may be configured to have an opening larger than the thickness of the lead frame 5, as in the same manner as the single inlet 555.

Having an increased number of inlets shorten the time required for injection of the first resin 30 and reduce the pressure required for injecting the first resin 30. Injecting the first resin 30 from two inlets, forming a wide flange portion 32, and removing the first resin remaining in the two inlets enables the package 100 to have a wide mounting area on the underside of the package, improving the stability of mounting the package.

Variant Embodiment 2

FIG. 7 shows the shape of the lead frame 5 as an example. The first electrode 10 and the second electrode 20 may have the same size or may have sizes different from each other.

The lead frame 5 may have through-holes in the package formation region 600 indicated by the imaginary rectangle lines in FIG. 7, in the middle of left and right shorter sides of the rectangle.

Variant Embodiment 3

In the package manufacturing method according to the first embodiment, the following steps may be performed after the steps (1) to (3):

(4-2) Cutting a Part Between the First Electrode and the First Connecting Portion After the first resin is molded, a part of the lead frame including the first through-hole or a part of the lead frame including the second through-hole is cut outside the package formation region.

Specifically, after the first resin is molded, a part between the first electrode and the first connecting portion is cut along a line traversing across the first through-hole. The first through-hole is formed so as to partially belong to the first electrode and partially belong to the first connecting portion. In other words, the first electrode and the first connecting portion are connected at two portions located at opposite sides of the first through-hole. One of those two portions at which the first electrode and the first connecting portion are connected is cut at the boundary thereof. Since the first through-hole is not filled with the first resin, only the first connecting portion is cut. When the boundary located between the first electrode and the first connecting portion has been cut, the part of the lead frame remained on the package side remains as the first electrode and the part of the lead frame connected to the frame side remains as the first connecting portion. The first through-hole is formed so as to partially belong to the first electrode and partially belong to the first connecting portion. Forming the first through-hole in the lead frame in advance reduces the area to be cut in the cutting step. A part of the first outer lead portion 11 becomes a part of the first through-hole 710.

The second electrode, the second connecting portion, and the second through-hole are cut in the same manner as the cutting step of the first electrode, the first connecting portion, and the first through-hole.

The entire boundary of a part between the first electrode and the first connecting portion may be cut in one operation or in plural operations by a cutter or dicer.

The cut surface formed by cutting the boundary between the first electrode and the first connecting portion preferably has a flat surface, but may have an uneven surface. The cut surface preferably has a surface perpendicular to a plane of the first electrode, but may have an inclined surface relative to the plane of the first electrode. The cut surface is plated with a metal in a latter plating step.

(5-2) Electroplating the First Electrode and the Second Electrode

The lead frame on which the first resin is molded is taken out of the mold. An electrical connection is made to the lead frame, and then electroplating is carried out to the first electrode and the second electrode. The lead frame is plated with a metal only at portions thereof that are exposed from the first resin. Thus, a plated metal layer is formed on the following: the upper surface and the lower surface of the first outer lead portion, the side surface of the first notch, the cut surface formed on the first outer lead portion, the upper surface and the lower surface of the first inner lead portion, the upper surface and the lower surface of the second outer lead portion, the side surface of the second notch, the cut surface formed on the second outer lead portion, and the upper surface and the lower surface of the second inner lead portion. Plating may be applied in a single layer, or in two or more layers. Two or more plating layers may be formed by repeating the electroplating step.

(6-2) Cutting Remaining Portion Between the First Electrode and the First Connecting Portion Cutting is performed on the first electrode, traversing across the first through-hole. In particular, the remaining portion between the first outer lead portion and the first connecting portion is cut. Likewise, cutting is performed on the second electrode, traversing across the second through-hole. In particular, the remaining portion between the second outer lead portion and the second connecting portion is cut.

In other words, a remaining portion of the lead frame including the first through-hole and a remaining portion of the lead frame including the second through-hole are cut at outer edges of the package formation region.

Preferably, this step of cutting those remaining portions is performed at the same time as the step of removing the injection flow mark corresponding to the inlet. Removing the injection flow mark and the remaining portion of the lead frame makes the distal end of the first electrode flush with the flange portion resulted in this step. This step may be performed such that the part of the flange portion resulted in this step has a width different form the width of the part of the flange portion formed in the second through-opening of the lead frame in plan view. The part of the flange portion having a different width may be used as a cathode mark or an anode mark.

Of the surfaces of the first outer lead portion, the upper surface, the lower surface, the first notch, and the side surface of one of the distal ends are plated, but the side surface of the other one of the distal ends, which corresponds to the remaining portion, is not plated.

After the first resin is cured or solidified, the injection flow mark corresponding to the inlet of the first resin is removed.

The first resin and the lead frame are cut to singulate the package. The package formation region has left and right shorter sides, along each of which both the lead frame and the first resin are disposed. The portion of the lead frame located along the cutting line may have a notch or through-hole having a circular shape, an elliptical shape, a polygonal shape, or approximately polygonal shape, to reduce the area of the lead frame to be cut.

In this embodiment, when the package is singulated from the lead frame, the leads of the package located at short sides of the package formation region are cut but the first resin is still held by the frame. In this state, exerting predetermined pressure from the frame to the package enables the singulation of the package. When the first resin has been injected and cured or solidified, the recessed portion of the upper mold is filled with the first resin. Thus, end portions of the first resin are also cut at the same time.

The injection flow mark of the first resin located adjacent to the first electrode is removed. By this removal operation, no injection flow mark remains on the surface of the package. This cutting operation for this removal may be performed either before or after the light emitting element is mounted. The above-described steps produce a package.

Making the flange portion have a small thickness facilitates the cutting operation of the first lead frame and the flange portion. The part of the flange portion located adjacent to the first electrode and cut first has the same thickness as the thickness of the first electrode, and part of the flange portion located adjacent to the first electrode and cut later has a thickness larger than the thickness of the first electrode. This facilitates the first cutting.

Example

An example will be described below with reference to the package according to the first embodiment. However, the invention is not limited to this example.

The size of the example described below may have an error of ±10%. The package 100 according to the example measured about 2.2 mm in longer side, about 1.4 mm in shorter side, and about 0.7 mm in height. These dimensions include the ones of the first electrode 10 and the second electrode 20. The lengthwise distance between the opposite outer sides 101 and 103 of the wall portion 31 was about 2.0 mm; the outer lead portion 11 of the first electrode 10 and the outer lead portion 21 of the second electrode 20 each were about 0.1 mm in length as measured from the wall portion 31 in the lengthwise direction. The first electrode 10 and the second electrode 20 each had a thickness of 0.1 mm. A part of the flange portion 32 located adjacent to and on one side of the first electrode 10 had a thickness of 0.2 mm; a part of the flange portion 32 located adjacent to and on the other side of the first electrode 10 had a thickness of 0.1 mm. The part of the flange portion 32 located adjacent to and on the one side of the first electrode 10 had a portion having a thickness of 0.1 mm, the same thickness as that of the first outer lead portion 11, near the first outer lead portion 11. Parts of the flange portion 32 located along the second outer side 102 and the third outer side 103 had a thickness of 0.1 mm. A part of the flange portion 32 located along the fourth outer side 104 had a thickness of 0.2 mm on the side near the first outer side 101 and a thickness of 0.1 mm on the side near the third outer side 103. The first notch 711 had a depth of about 0.05 mm from the distal end of the first outer lead portion 11; the second notch 721 had a depth of about 0.05 mm from the distal end of the second outer lead portion 12. The inner sides of the wall portion 31 were in an approximately rounded rectangular shape in plan view, which measured about 1.65 mm in longer side and about 1.1 mm in shorter side.

The first electrode 10 and the second electrode 20 were formed of a copper-based material. Silver plating was applied to surfaces of the first electrode 10 and the second electrode 20 exposed from the first resin 30. The first resin 30 was made of a polyamide resin containing titanium oxide as a light reflecting material. The second resin 300 was a silicone resin. As the light emitting element 200, one formed by stacking nitride semiconductor layers on a sapphire substrate was used. As the wires 250 electrically connecting between the light emitting element 200 and the first electrode 10 and between the light emitting element 200 and the second electrode 20, wires containing gold as a major component were used. These configurations provided a thin-profile light emitting device.

The light emitting devices of the embodiments according to the present disclosure are applicable to lighting devices and automotive light emitting devices.

What is claimed is:

1. A package having a bottomed recess with a bottom portion, comprising:
    a first electrode having a first outer lead portion and disposed in the bottom portion;
    a second electrode having a second outer lead portion and disposed in the bottom portion; and
    a first resin fixing the first electrode and the second electrode and constituting a part of the bottomed recess, wherein the first resin has:
    a part between the first electrode and the second electrode disposed in the bottom portion;
    a wall portion constituting side walls of the bottomed recess; and
    a flange portion having a first part located adjacent to at least one of both sides of the first outer lead portion in plan view, the first part having a thickness different from a thickness of the first outer lead portion.

2. A package according to claim 1, wherein, in plan view, the bottomed recess has:
    a first outer side;
    a second outer side adjacent to the first outer side;
    a third outer side adjacent to the second outer side and opposite to the first outer side; and
    a fourth outer side adjacent to the first outer side and the third outer side,
    wherein the first outer lead portion is located at the first outer side, and wherein the second outer lead portion is located at the third outer side.

3. A package according to claim 1, wherein the first part of the flange portion has a thickness of 1.2 to 2.0 times the thickness of the first outer lead portion.

4. A package according to claim 1, wherein the first part of the flange portion has a portion having a thickness of 1.2 to 2.0 times the thickness of the first outer lead portion and a portion having a same thickness as the thickness of the first outer lead portion.

5. A package according to claim 1, wherein the first part of the flange portion has a thickness of 0.5 to 0.8 times the thickness of the first outer lead portion.

6. A package according to claim 1, wherein the first part of the flange portion has a portion having a thickness of 0.5 to 0.8 times the thickness of the first outer lead portion and a portion having a same thickness as the thickness of the first outer lead portion.

7. A package according to claim 1, wherein the first part of the flange portion has an approximately same width as a width of the first outer lead portion.

8. A package according to claim 1, wherein the flange portion further has a second part located adjacent to at least one of both sides of the second outer lead portion in plan view, the second part having a thickness different from a thickness of the second outer lead portion.

9. A package according to claim 2, wherein the flange portion further has parts respectively located at the second outer side and the fourth outer side.

10. A package according to claim 9, wherein the part of the flange portion located at the second outer side and the part of the flange portion located at the fourth outer side have an approximately same width.

11. A package according to claim 2, wherein the second outer side and the fourth outer side are composed of the first resin only.

12. A package according to claim 2, wherein the first part of the flange portion and the part of the flange portion located at the second outer side have an approximately same width.

13. A package according to claim 1, wherein the first outer lead portion has a distal end at which a first notch is formed in plan view.

14. A package according to claim 13, wherein an upper surface and a lower surface of the first outer lead portion, and a side surface of the first notch are plated with a metal.

15. A package according to claim 1, wherein the part of the first resin located in between the first electrode and the second electrode has a thickness smaller than the thickness of the first electrode.

16. A package according to claim 1, wherein the part of the first resin located in between the first electrode and the second electrode is recessed inwardly in bottom view.

17. A package according to claim 1, wherein the first resin is a thermoplastic resin.

18. A light emitting device comprising:
    a package according to claim 13; and
    a light emitting element mounted on at least one of the first electrode and the second electrode of the package.

19. A light emitting device according to claim 18, wherein the light emitting element is encapsulated with a second resin.

20. A light-emitting device according to claim 19, wherein the second resin is transparent.

* * * * *